(12) United States Patent
Minato et al.

(10) Patent No.: US 7,701,003 B2
(45) Date of Patent: Apr. 20, 2010

(54) SEMICONDUCTOR DEVICE AND MANUFACTURING METHOD THEREOF

(75) Inventors: Tadaharu Minato, Chiyoda-ku (JP); Kazutoyo Takano, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/956,904

(22) Filed: Dec. 14, 2007

(65) Prior Publication Data

US 2008/0315249 A1 Dec. 25, 2008

(30) Foreign Application Priority Data

Jun. 20, 2007 (JP) .............................. 2007-162733

(51) Int. Cl.
*H01L 29/739* (2006.01)
(52) U.S. Cl. ..................... 257/330; 257/331; 257/332; 257/334; 257/E27.091
(58) Field of Classification Search ................. 257/330, 257/331, 332, 334, E27.091
See application file for complete search history.

(56) References Cited

U.S. PATENT DOCUMENTS

| 6,111,290 | A | 8/2000 | Uenishi et al. |
| 6,781,199 | B2 | 8/2004 | Takahashi |
| 6,781,200 | B2 | 8/2004 | Ishimura et al. |
| 6,953,968 | B2 | 10/2005 | Nakamura et al. |
| 2005/0280029 | A1* | 12/2005 | Nakamura et al. .......... 257/192 |
| 2006/0214222 | A1* | 9/2006 | Challa et al. ................. 257/328 |

FOREIGN PATENT DOCUMENTS

| DE | 198 07 745 A1 | 1/1999 |
| JP | 2002-353456 | 12/2002 |
| JP | 2007-074006 | 3/2007 |
| KR | 2003-0084563 | 11/2003 |
| WO | 02/058160 A1 | 7/2002 |

OTHER PUBLICATIONS

Dipankar Pramanik, et al., "Barrier Metals for ULSI: Processing and Reliability", Solid State Technology, May 1991, pp. 97-102.
M. Wittmer, et al., "Applications of TiN Thin Films in Silicon Device Technology", Thin Solid Films, vol. 93, 1982, pp. 397-405.
Katsumi Nakamura, et al., "Advanced Wide Cell Pitch CSTBTs Having Light Punch-Through (LPT) Structures", IEEE, 2002, pp. 277-280.

* cited by examiner

*Primary Examiner*—Sue Purvis
*Assistant Examiner*—Tan N Tran
(74) *Attorney, Agent, or Firm*—Oblon, Spivak, McClelland, Maier & Neustadt, L.L.P.

(57) ABSTRACT

A semiconductor substrate has a trench in a first main surface. An insulated gate field effect part includes a gate electrode formed in the first main surface. A potential fixing electrode fills the trench and has an expanding part expanding on the first main surface so that a width thereof is larger than the width of the trench. An emitter electrode is formed on the first main surface and insulated from the gate electrode electrically and connected to a whole upper surface of the expanding part of the potential fixing electrode. Thus, a semiconductor device capable of enhancing reliability in order to prevent an aluminum spike from generating and a manufacturing method thereof can be provided.

4 Claims, 17 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Background Art

As a power semiconductor device as a switching element for driving a motor and the like, an IGBT (Insulated Gate Bipolar Transistor) is mainly used in a region where a regular voltage is 300V or more.

As such a power semiconductor device, a constitution, in which two types of trench inside IGBT cells are provided for both a gate-trench and a non-gate trench filled with a conducting material directly connected to an emitter electrode to have the same potential of emitter region not a gate, has been conventionally proposed (refer to Japanese Patent Laying-Open No. 2002-353456, and Pamphlet of International Publication No. WO 02/058160).

Especially, according to the Japanese Patent Laying-Open No. 2002-353456, the gate electrode of the IGBT and the filling layer having the emitter potential are formed in the same step.

According to the manufacturing process, a trench for the gate electrode and a trench for the filling layer are first formed in a substrate, and a first insulation film is formed so as to cover an inner wall of each of the trenches. Then, a conductive layer is formed on a whole surface of the substrate so as to fill the trenches, and the conductive layer is fully etched away. Thus, the conductive layer remains only in each of the trenches, whereby the gate electrode and the filling layer are formed.

Then, a second insulation film is formed on a whole surface of the substrate so as to cover the gate electrode and the filling layer, and the second insulation film is selectively etched away. Thus, a contact hole exposing the periphery of the filling layer is formed on the second insulation film, and the second insulation film on the gate electrode remains. Thereafter, when an emitter electrode is formed on a whole surface, the emitter electrode is electrically connected to the filling layer through the contact hole, and electrically insulated from the gate electrode by the second insulation film.

Thus, the gate electrode of the IGBT and the filling layer having the emitter potential are formed in the same step.

However, according to the constitution and manufacturing method disclosed in the Japanese Patent Laying-Open No. 2002-353456, a fine gap is generated between the filling layer and the trench inner wall, and an aluminum spike is generated at that part, which lowers the reliability. This will be described hereinafter.

According to the manufacturing method disclosed in the Japanese Patent Laying-Open No. 2002-353456, several tens % of the thickness of the second insulation film is processed by overetching in general in the etching process for forming the contact hole. This overetching is performed in view of the variation in thickness of the second insulation film on a wafer surface and between wafer surfaces and variation in etching speed of an etching equipment.

A predetermined amount of the first insulation film formed between the filling layer and the inner wall surface of the trench is etched away by this overetching. Thus, an extremely small gap as much as the thickness of a gate oxide film is generated between the filling layer and the inner wall surface of the trench.

In addition, before a high melting point metal to form silicide by contact with silicon is formed by sputtering or the like, the surface is etched with fluorinated acid (HF) in order to remove a natural oxide film of the exposed part of silicon in addition to general cleaning of the contact hole part using acid or alkaline fluid. Also at this time of etching, a predetermined amount of the first insulation film formed between the filling layer and the inner wall surface of the trench is etched away. Thus, the first insulation film between the filling layer and the inner wall surface of the trench is further deeply etched away.

The gap generated as described above is as fine as a processing dimension of the most advanced LSI (Large Scale Integrated Circuit) and has a sectional structure that can be regarded as a double contact hole generated in the contact hole. Therefore, even when a sputtering apparatus used for the most advanced LSI is used, it is extremely difficult to fill this gap with a metal film such as titanium (Ti) film as a barrier layer. Even when a metal film is put on the gap, it is inevitable that the film is thinned and a pinhole is generated.

As a result, aluminum as an emitter electrode material and silicon as a substrate material are directly reacted through the metal film having a low barrier property by a heat treatment in the following step or electro migration reaction generated when a current is applied for a normal element operation. Thus, silicon is diffused in aluminum, and at the same time, aluminum eats away in the silicon as a spike (that is, an aluminum spike is generated), so that the electric characteristics are considerably damaged and long-term reliability cannot be maintained.

SUMMARY OF THE INVENTION

The present invention was made in view of the above problem, and it is an object of the present invention to provide a semiconductor device capable of enhancing reliability in order to prevent an aluminum spike from generating, and a manufacturing method thereof.

A semiconductor device according to the present invention includes a semiconductor substrate, an element, a potential fixing electrode, and first main electrodes. The semiconductor substrate has a first main surface and a trench in the first main surface. The element has an insulated gate field effect part including a gate electrode formed in the first main surface. The potential fixing electrode fills the trench and has an expanding part on the first main surface so that a width thereof is larger than that of the trench. The first main electrodes are formed on the first main surface, electrically insulated from the gate electrode, and connected to a whole upper surface of the expanding part of the potential fixing electrode.

A manufacturing method of a semiconductor device according to the present invention includes the following steps.

A trench is formed in a main surface of a semiconductor substrate. A conductive layer is formed on the main surface so as to fill the trench. A potential fixing electrode filling the trench and having an expanding part expanding on the main surface so that a width thereof is larger than that of the trench is formed and a gate electrode is formed on the main surface by patterning the conductive layer. Insulation layers are formed so as to cover the gate electrode and expose the expanding part of the potential fixing electrode. Main electrodes are formed so as to be electrically insulated from the gate electrode and connected to a whole upper surface of the expanding part of the potential fixing electrode.

According to the present invention, since the potential fixing electrode expands on the first main surface so that a width thereof is larger than the trench width, a gap is prevented from being generated between the potential fixing electrode and the wall surface of the trench. Thus, a highly reliable semiconductor device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings hereinafter.

Embodiment 1

Figure 1:
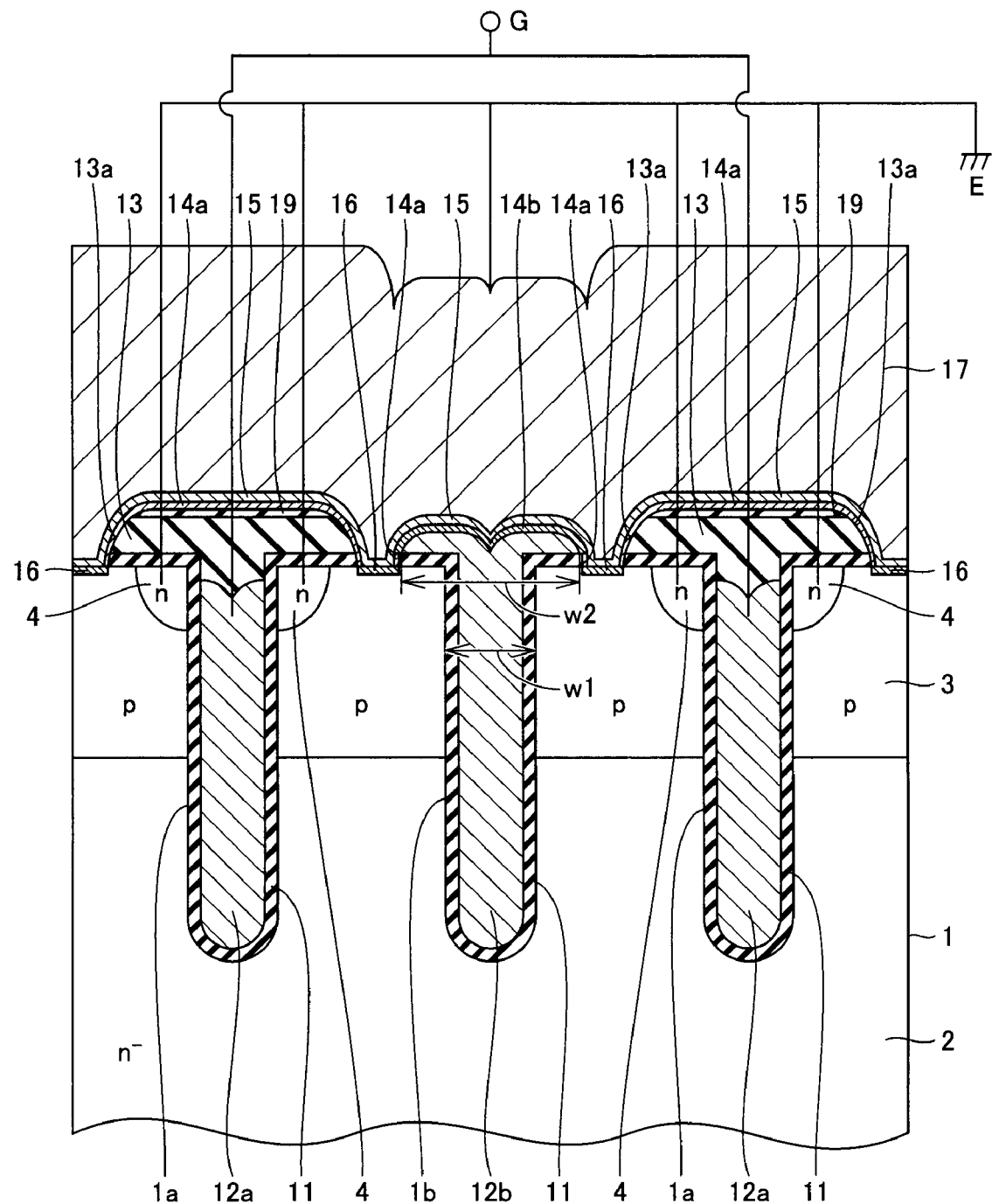
FIG. 1 is a sectional view schematically showing the constitution of a semiconductor device according to Embodiment 1 of the present invention.

With reference to FIG. 1, a semiconductor device according to the present embodiment can be applied to a vertical or lateral MOSFET (Metal Oxide Semiconductor Field Effect Transistor), an IGBT and the like.

Description will be made taking as an example the constitution of an MOS gate part on a surface of the IGBT or MOSFET having a trench gate structure. While an n-channel MOS gate will be taken as an example for convenience of the description, the constitution and effect are the same with the MOS gate of an opposite conductivity type, that is, a p-channel type.

For example, an $n^-$ region 2 serving as a drift region is formed in a semiconductor substrate 1 formed of silicon. A p-type region 3 serving as a base region, for example, is formed on $n^-$ region 2 on the first main surface side of semiconductor substrate 1. An n-type region 4 serving as an emitter region (source region) is selectively formed in p-type region 3 on the first main surface side of semiconductor substrate 1.

A trench 1a is formed in the first main surface of semiconductor substrate 1 so as to penetrate n-type region 4 and p-type region 3 and reach $n^-$ region 2. In addition, a trench 1b is formed in the first main surface of semiconductor substrate 1 in which n-type region 4 is not formed so as to penetrate p-type region 3 and reach $n^-$ region 2. An insulation film 11 formed of a silicon oxide film is formed so as to cover the inner wall surface of each of trenches 1a and 1b and the first main surface of semiconductor substrate 1.

A gate electrode 12a serving as a control electrode is formed in trench 1a. Gate electrodes 12a are formed so as to be opposed across p-type region 3 sandwiched between $n^-$ region 2 and n-type region 4, and insulation film (gate insulation film) 11. Thus, insulated gate field effect part is formed of gate electrode 12a, insulation film (gate insulation film) 11, the $n^-$ region 2, the n-type region 4, and p-type region 3.

Gate electrode 12a is formed of a material having a conductive property such as a polycrystalline silicon layer doped with an impurity (referred to as the doped polysilicon layer hereinafter), for example. Gate electrode 12a is formed only in trench 1a and does not project from trench 1a upward of the first main surface of semiconductor substrate 1.

A potential fixing electrode 12b is formed in trench 1b. Potential fixing electrode 12b is formed of a material having a conductive property such as the doped polysilicon layer, for example. Potential fixing electrode 12b has a part projecting from trench 1b upward of the first main surface of semiconductor substrate 1 and this projecting part has an expanding part expanding in the lateral direction (in the in-plane direction of the fist main surface) so as to have a width w2 larger than the width w1 of trench 1b. In addition, insulation film 11 is positioned between the expanding part of potential fixing electrode 12b and semiconductor substrate 1.

An insulation film 13 formed of such as a silicon oxide film is formed on the first main surface of semiconductor substrate 1. Insulation film 13 has a contact hole 13a covering over gate electrode 12a and exposing the whole upper surface of the expanding part of potential fixing electrode 12b and a part of the first main surface of semiconductor substrate 1. An insulation film 19 formed of a silicon oxide film is formed on insulation film 13. In addition, insulation film 11 is positioned between insulation film 13 and semiconductor substrate 1.

A main electrode serving as an emitter electrode (or a source electrode) is formed on insulation films 13 and 19 and on contact hole 13a. The main electrode is connected to the whole upper surface of the expanding part of potential fixing electrode 12b exposed from contact hole 13a and electrically insulated from gate electrode 12a by insulation films 13 and 19.

The main electrode has silicide layers 14b and 16, a high melting point metal layer 14a, a barrier metal layer 15, and a conductive layer 17. Silicide layer 14b is formed on the whole upper surface of the expanding part of potential fixing electrode 12b. Silicide layer 16 is formed on the surface of semiconductor substrate 1 exposed from contact hole 13a. High melting point metal layer 14a is formed on each of insulation films 11, 13 and 19. Barrier metal layer 15 is formed on silicide layers 14b and 16 and high melting point metal layer 14a. Conductive layer 17 is formed on barrier metal layer 15.

Since high melting point metal layer 14a is an unreacted titanium (Ti) layer at the time of forming silicide, it does not exist in many cases, and even when it exists, it is extremely thin. Silicide layers 14b and 16 are formed of titanium silicide ($TiSi_2$). Barrier metal layer 15 is a metal film or a metal compound film formed in order to prevent the reaction between semiconductor substrate 1 and conductive layer 17 and it is formed of titanium nitride (TiN) layer. Conductive layer 17 is formed of a material having a melting point lower than that of barrier metal layer 15 and a resistivity lower than those of high melting point metal layer 14a and barrier metal layer 15. When the silicon content ratio of conductive layer 17 is higher than 1%, conductive layer 17 hardly reacts with the substrate silicon, which is no problem but when conductive layer 17 is formed of a material that hardly generates silicon nodule, that is, an aluminum-silicon (AlSi) alloy containing less than 1% of silicon or pure aluminum in view of wire bonding characteristics that will be described below, it has a property that is likely to react with the silicon material of the substrate as compared with high melting point metal layer 14a and barrier metal layer 15.

Next, a manufacturing method according to the present embodiment will be described.

Figure 2:
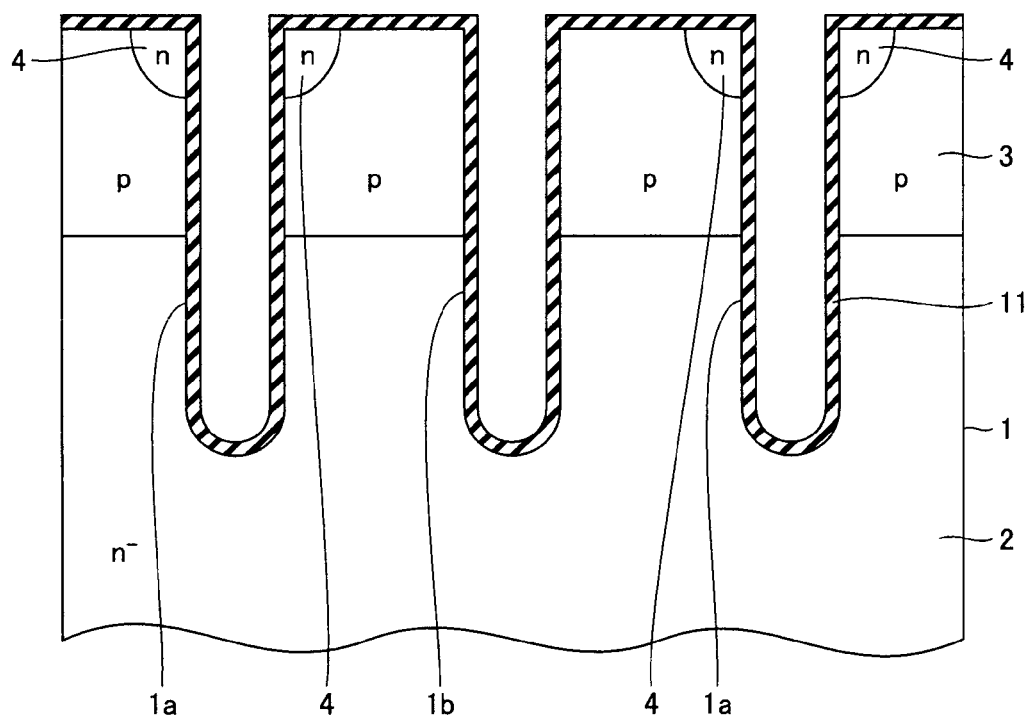
FIGS. 2 to 11 are schematic sectional view showing a manufacturing method of the semiconductor device according to Embodiment 1 of the present invention step by step.

With reference to FIG. 2, p-type region 3 and n-type region 4 are formed on the first main surface of semiconductor substrate 1 having n⁻ region 2. Then, trench 1a penetrating both n-type region 4 and p-type region 3 and reaching n⁻ region 2, and trench 1b penetrating p-type region 3 in which n-type region 4 is not formed and reaching n⁻ region 2 are formed in the first main surface of semiconductor substrate 1. Insulation film 11 is formed so as to cover the inner wall surface of trenches 1a and 1b and the first main surface of semiconductor substrate 1. Insulation film 11 is a silicon oxide film formed by a thermal oxidation method, a silicon oxide film or a silicon nitride film formed by a CVD (Chemical Vapor Deposition) method, or combination of the above films.

Figure 3:
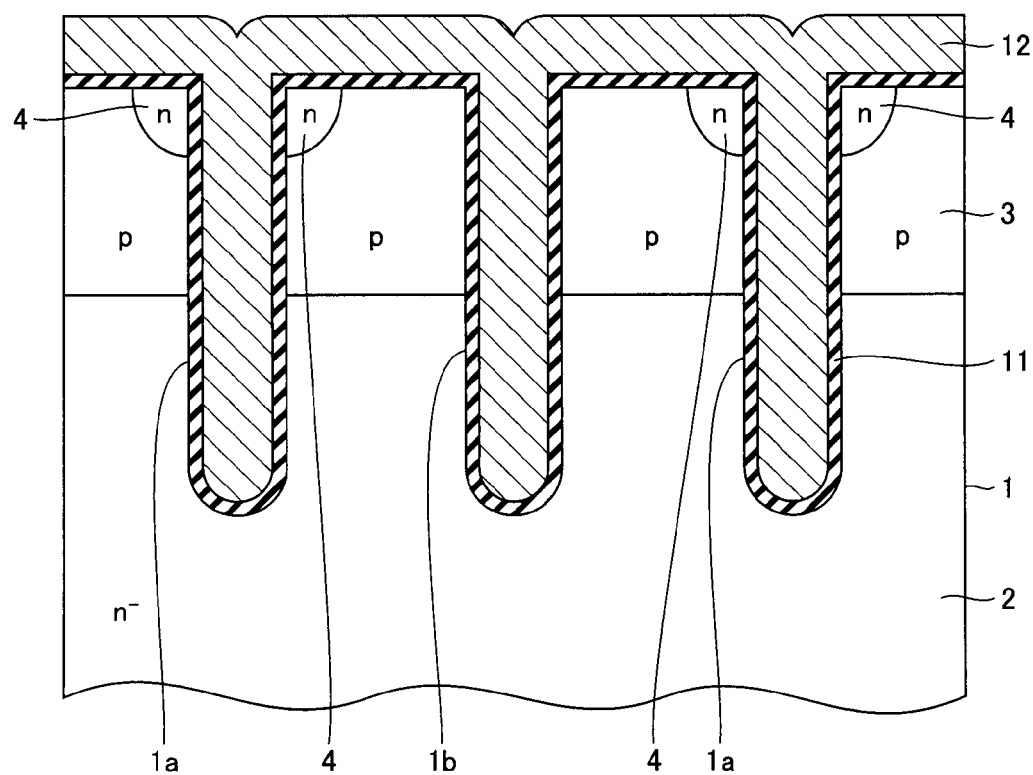

With reference to FIG. 3, a conductive layer 12 formed of a doped polysilicon film, for example, is formed on the first main surface of semiconductor substrate 1 to fill trenches 1a and 1b. In order to thin conductive layer 12, whole conductive layer 12 is etched back as a whole in some cases.

Figure 4:
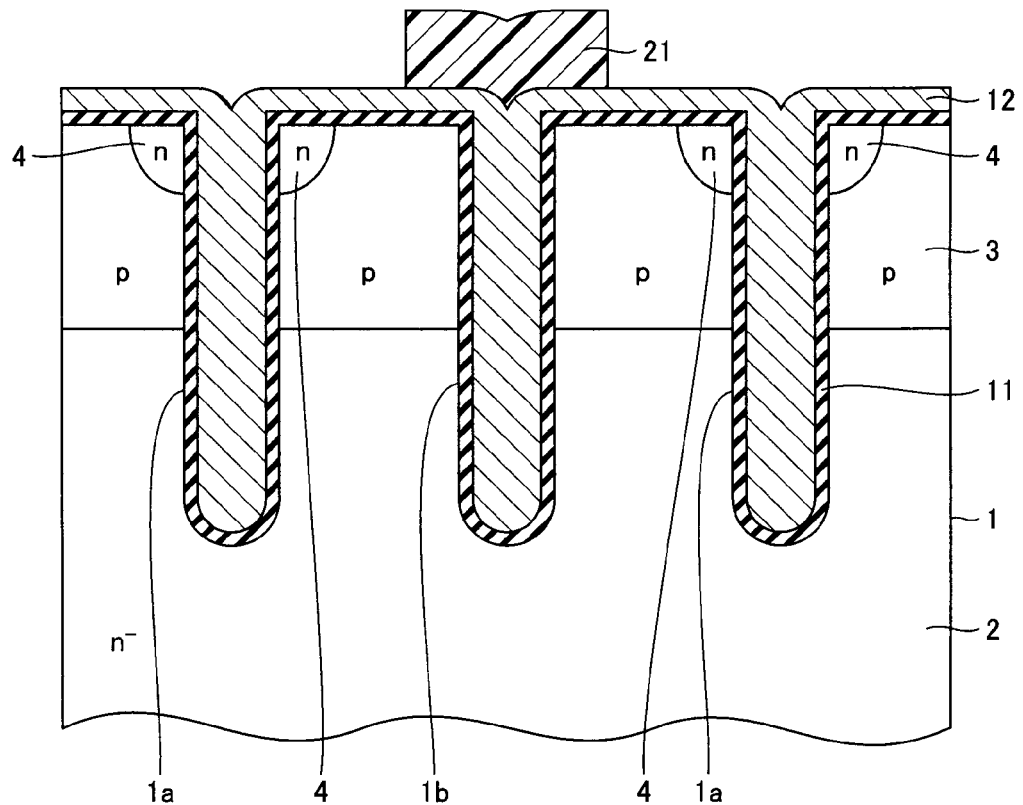

With reference to FIG. 4, a photoresist 21 is applied by a general photoengraving technique and then exposed and developed. Thus, resist pattern 21 having a width larger than that of trench 1b is formed on trench 1b.

Figure 5:
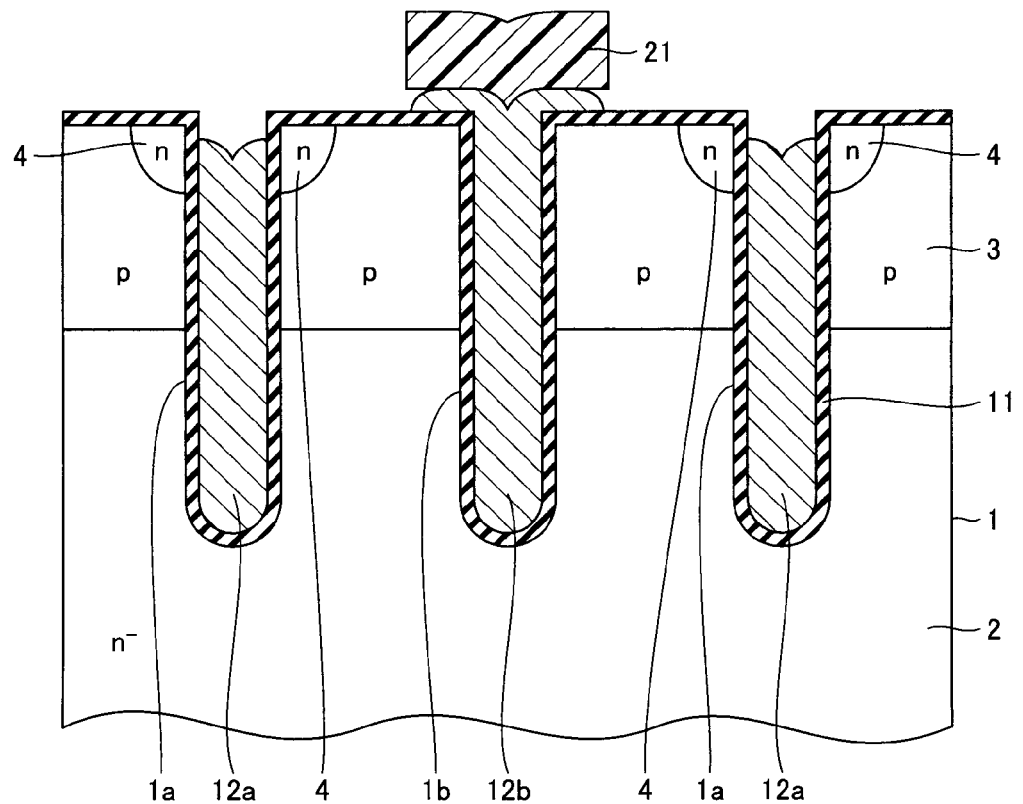

With reference to FIG. 5, using resist pattern 21 as a mask, conductive layer 12 is processed by dry etching. The dry etching is performed until the surface of insulation film 11 is exposed at least, whereby conductive layer 12 is selectively removed and conductive layer 12a in trench 1a and conductive layer 12b just under resist pattern 21 remain.

Conductive layer 12a remains only in trench 1a, and the upper surface of conductive layer 12a is retreated from the first main surface of semiconductor substrate 1 (that is, downward of the first main surface in the drawing). The gate electrode is formed by conductive layer 12a.

Conductive layer 12b fills trench 1b, and projects upward from trench 1b so as to be higher than the first main surface of semiconductor substrate 1 and the projecting part expands so that the width thereof is larger than that of trench 1b. Thus, potential fixing electrode 12b is formed by conductive layer 12b.

Then, resist pattern 21 is removed by ashing or the like.

Figure 6:
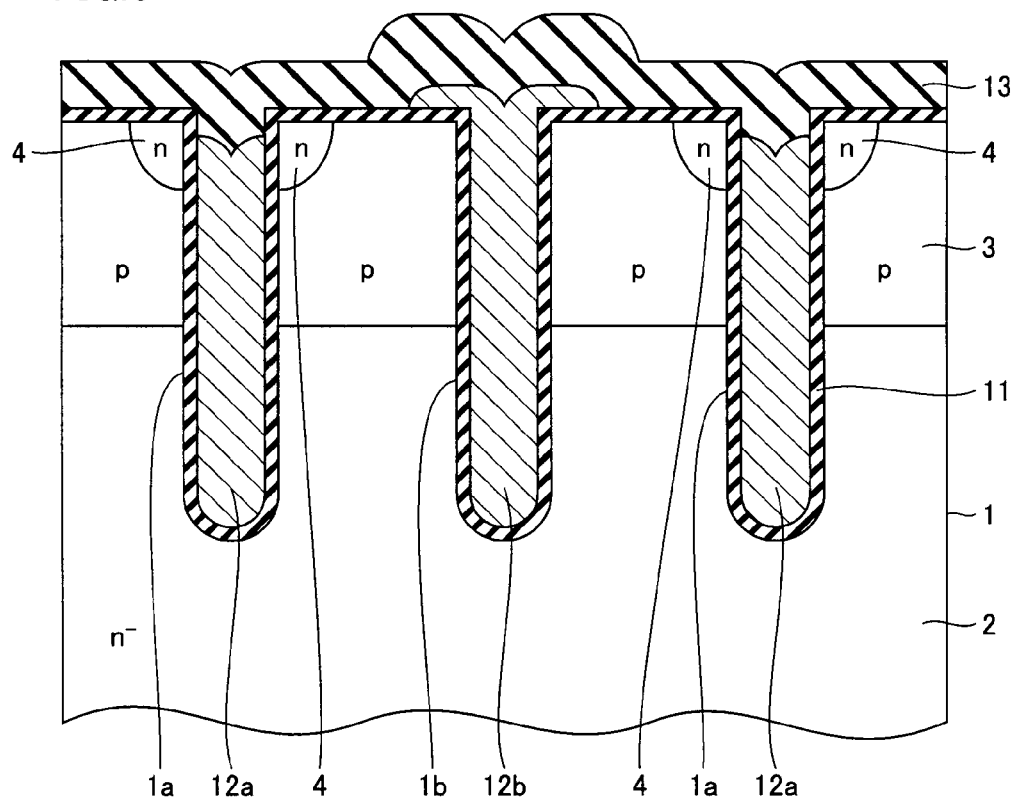

With reference to FIG. 6, insulation film 13 is formed so as to cover the first main surface of semiconductor substrate 1. Insulation film 13 may be any of PSG (Phospho Silicate Glass), BPSG (Boro-Phospho Silicate Glass), BP (Boro-Phospho)-TEOS (Tetra-Ethyl-Ortho-Silicate) silicon oxide film.

Figure 7:
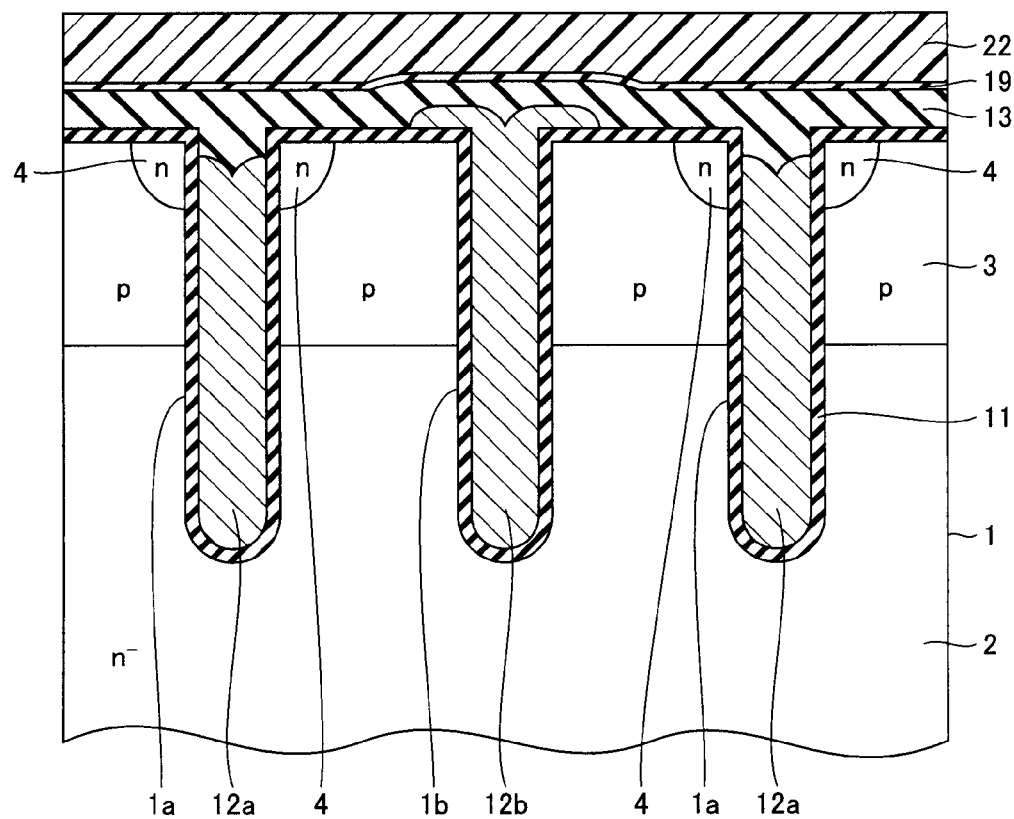

With reference to FIG. 7, insulation film 13 is reflowed by a heat treatment and an upper surface thereof is flattened. Then, in order to enhance adhesion with a photoengraving photoresist, insulation film 19 formed of a silicon oxide film, for example, is formed by a low-pressure CVD method and the like. Then, a photoresist 22 is applied to insulation film 19.

Insulation film 19 is not necessarily formed, and photoresist 22 may be directly applied onto insulation film 13.

Figure 8:
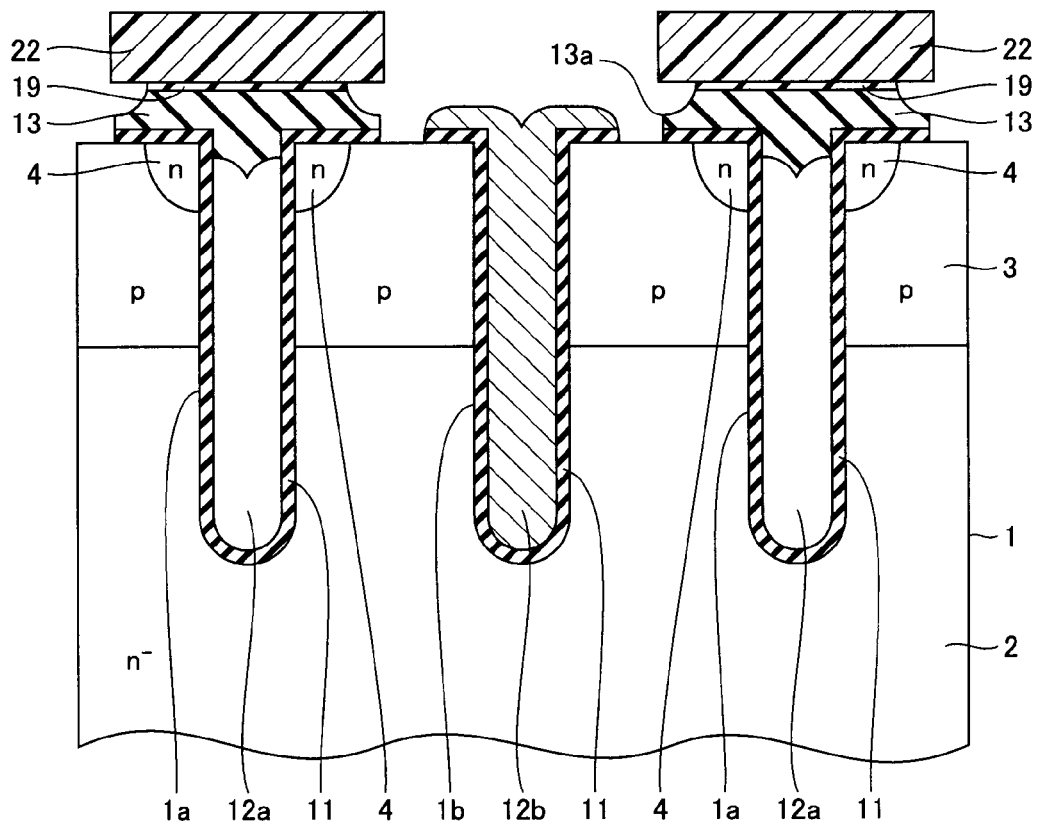

With reference to FIG. 8, photoresist 22 is exposed and developed by a general photoengraving technique and patterned into a predetermined shape. Resist pattern 22 is patterned so as to cover gate electrode 12a and open potential fixing electrode 12b and a peripheral part thereof.

Using the resist pattern as a mask, insulation films 19 and 13 are processed by wet etching and then processed by dray etching. Thus, contact hole 13a reaching the upper surface of the expanding part of potential fixing electrode 12b and the surface of semiconductor substrate 1 is formed in insulation films 19 and 13. Then, resist pattern 22 is removed by ashing and the like.

Insulation films 19 and 13 may be processed only by dray etching or only by wet etching in forming contact hole 13a.

Figure 9:
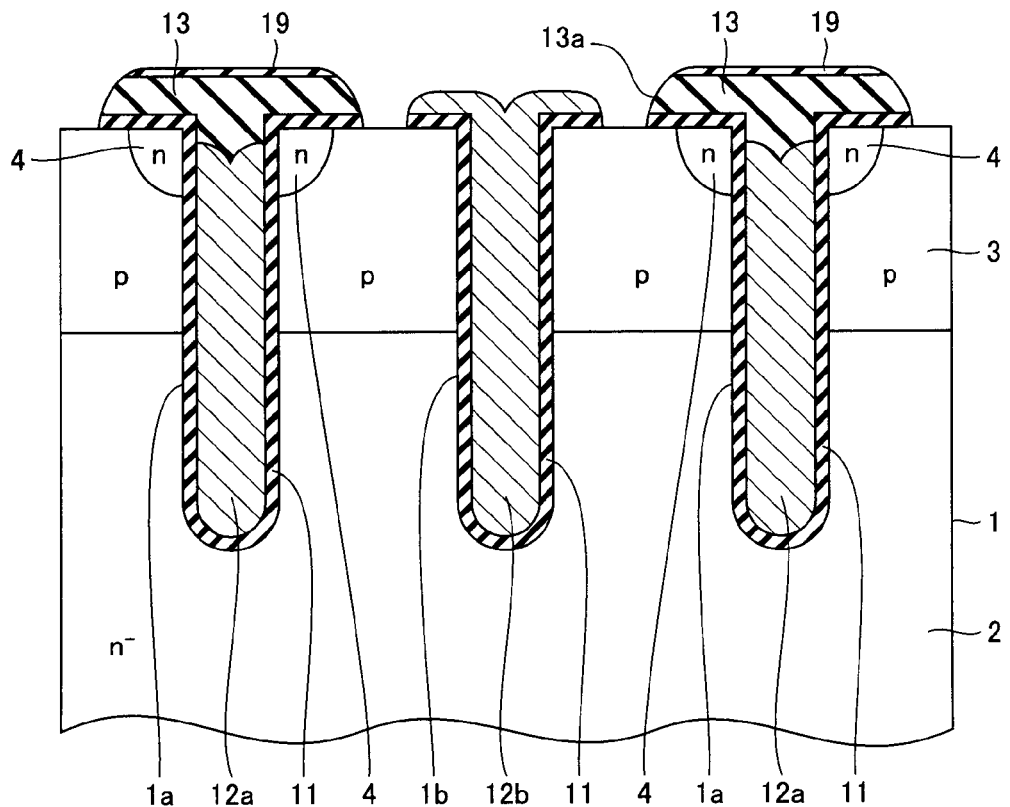

With reference to FIG. 9, a heat treatment (reflowing) is performed to round the shape of the open end of contact hole 13a of insulation films 19 and 13.

Figure 10:
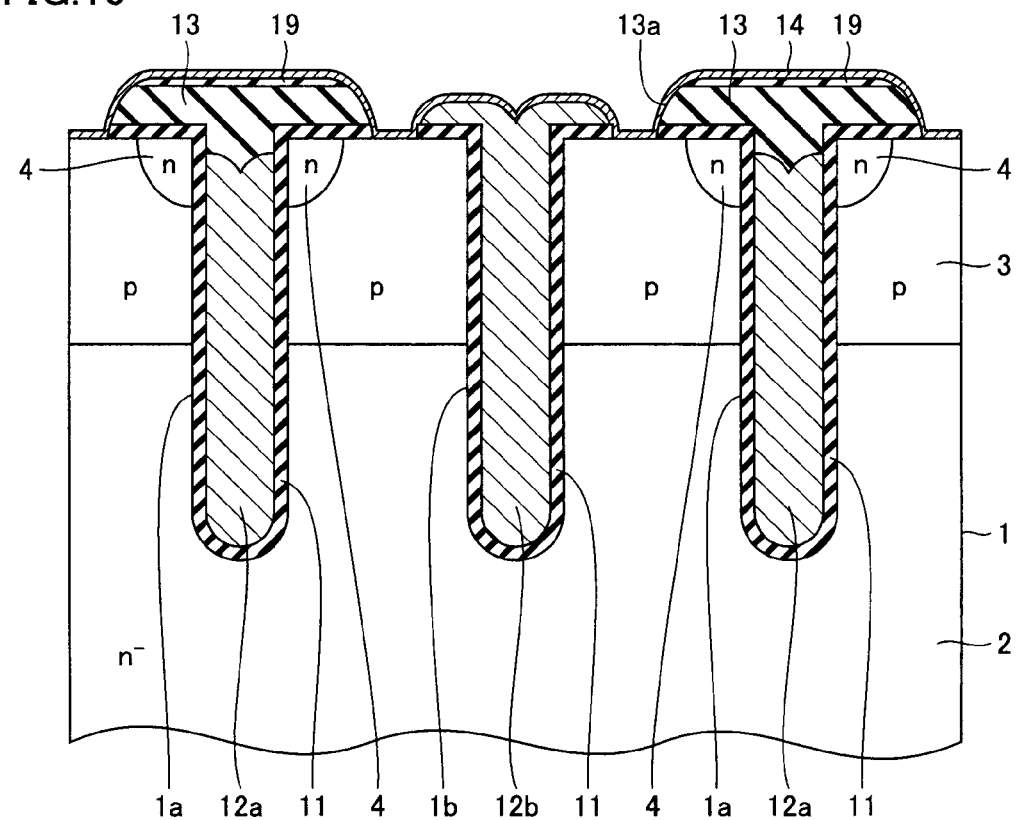

With reference to FIG. 10, a high melting point metal 14 made of titanium, for example, is formed so as to cover the whole surface.

Figure 11:
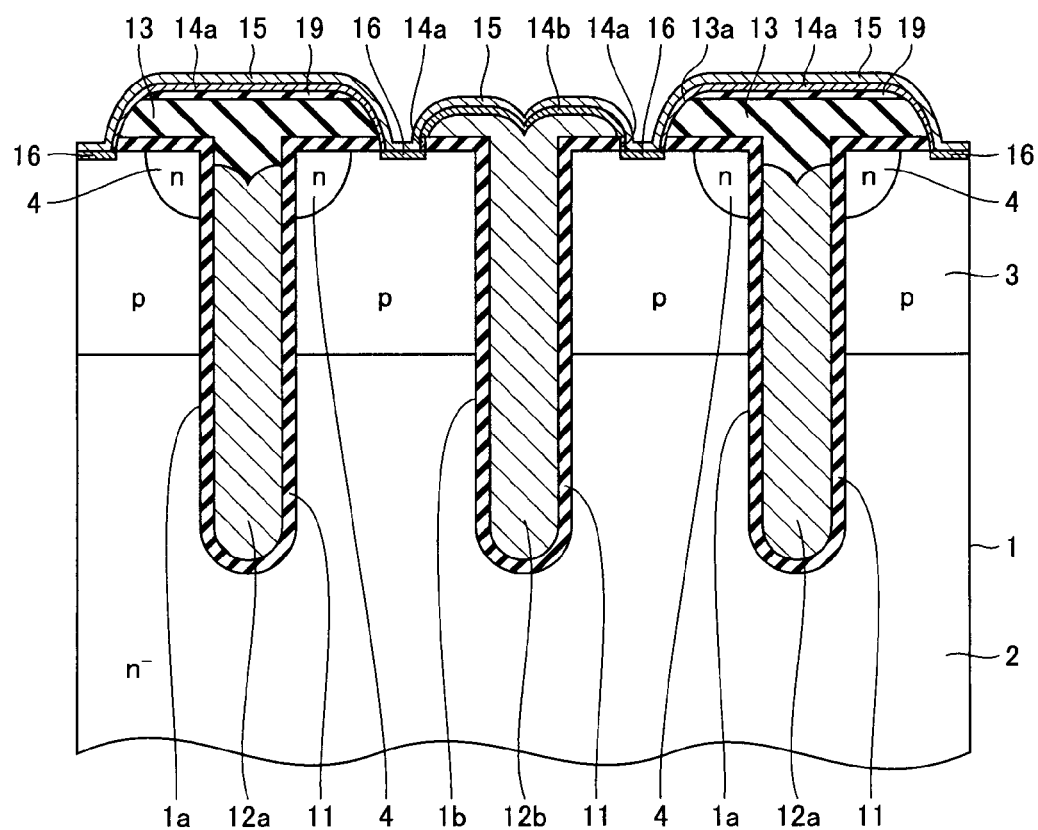

With reference to FIG. 11, barrier metal layer 15 made of titanium nitride (TiN), for example, is formed by a reactive sputtering method, for example. Then, high melting point metal 14 is processed by a RTA (Rapid Thermal Anneal) process such as lamp annealing through barrier metal layer 15. Thus, the high melting point metal of high melting point metal 14 reacts with the silicon of conductive layer 12 or semiconductor substrate 1 and silicide layers ($TiSi_2$) 14b and 16 consisting of high melting point metal and silicon are formed. That is, silicide layer 14b is formed at the contact part between high melting point metal 14 and conductive layer 12 and silicide layer 16 is formed at the contact part between high melting point metal 14 and semiconductor substrate 1.

At this time, high melting point metal 14 on insulation films 11, 13 and 19 does not react and remains as unreacted high melting point metal layer (titanium layer, for example) 14a in some cases.

Thereafter, conductive layer 17 made of aluminum, for example, is formed on the whole surface, and heat treatment is performed to stabilize barrier metal layer 15, conductive layer 17 and the like, whereby the semiconductor device according to the present embodiment shown in FIG. 1 is completed.

According to the present embodiment, since there is no gap generated between potential fixing electrode 12b and the inner wall surface of trench 1b, the semiconductor device can be highly reliable. This reason will be described hereinafter.

Figure 12:
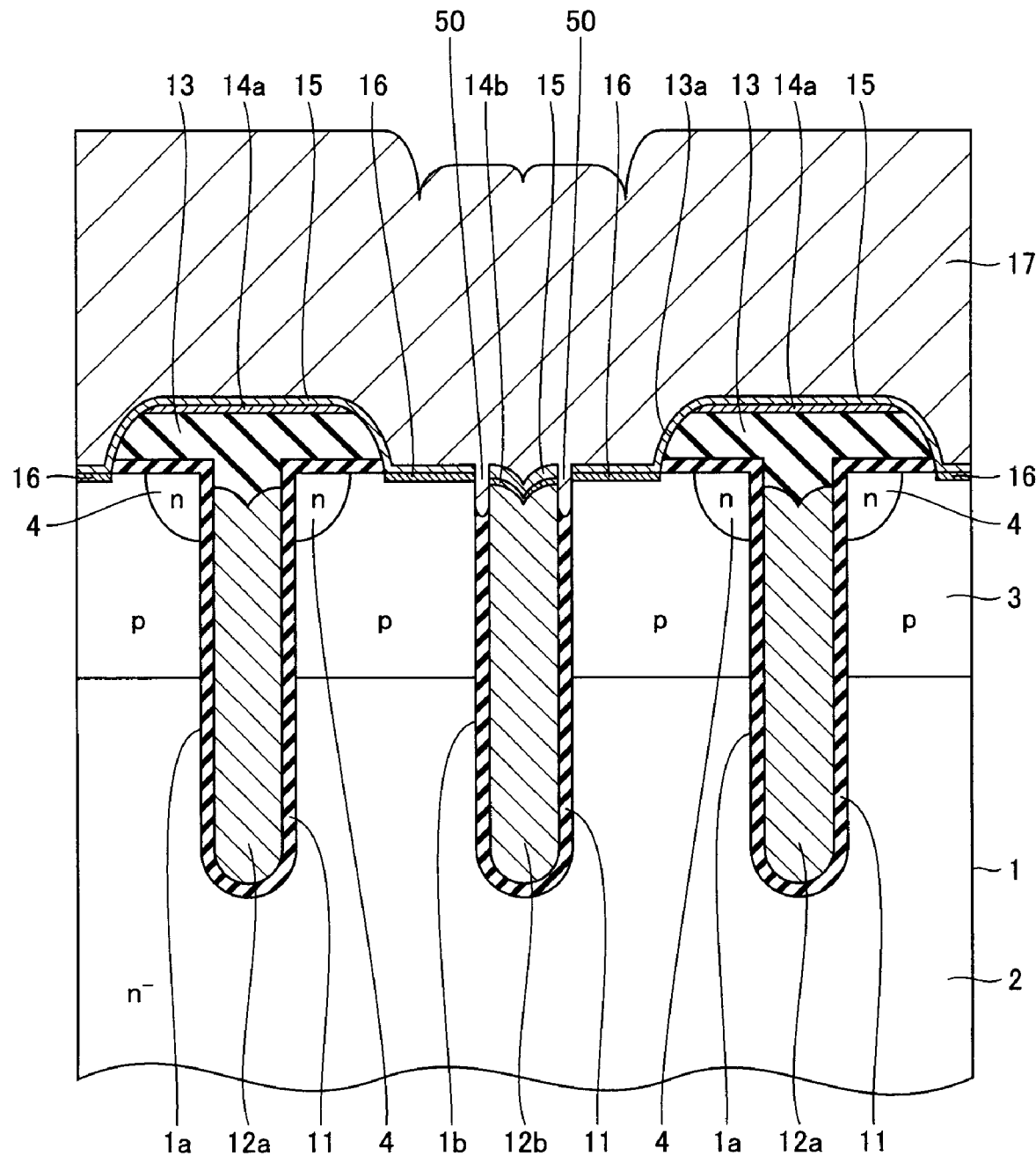
FIG. 12 is a schematic sectional view showing a state where a gap is generated between potential fixing electrode 12b and the inner wall surface of trench 1b.

With reference to FIG. 12, in the case where potential fixing electrode 12b is formed only in trench 1b, when contact hole 13a is formed in insulation film 13, insulation film 11 between potential fixing electrode 12b and the inner wall surface of trench 1b is also etched away. In this case, an extremely small gap 50 is formed between potential fixing electrode 12b and the inner wall surface of trench 1b.

In addition, in a case where the high melting point metal to form silicide layers 14b and 16 by contact with silicon is formed by sputtering or the like, before being formed, the surface is etched away with fluorinated acid in order to remove a natural oxidation film at the silicon exposed part. By such etching, insulation film 11 may be further deeply etched.

It is extremely difficult to fill this extremely small gap 50 generated as described above, with the high melting point metal and barrier metal layer 15. Further, even when the high melting point metal and barrier metal layer 15 are put on gap 50 so as to cover it, it is inevitable that film thickness thereof becomes small and a pinhole is generated.

When an aluminum layer is formed as conductive layer 17 in this state, the aluminum of conductive layer 17 comes in contact with the silicon of semiconductor substrate 1 and the silicon of potential fixing electrode 12b directly, or conductive layer 17 is formed through the metal film having a low barrier property. Thus, in this case, the silicon is diffused in the aluminum and at the same time, the aluminum eats away in the silicon as a spike (that is, an aluminum spike is generated), so that the electric characteristics are considerably damaged and long-term reliability cannot maintained in some cases.

Meanwhile, according to the present embodiment, as shown in FIG. 1, potential fixing electrode 12b has the expanding part expanding on the first main surface such that width w2 thereof is larger than width w1 of trench 1b. Thus, the expanding part of potential fixing electrode 12b covers insulation film 11 between the inner wall surface of trench 1b and potential fixing electrode 12b. Therefore, at the time of etching for forming the contact hole shown in FIG. 8, insulation film 11 between the inner wall surface of trench 1b and potential fixing electrode 12b can be prevented from being etched away. Thus, since the extremely small gap can be prevented from being generated, the barrier property of the barrier metal does not deteriorate on this extremely small gap. Therefore, the aluminum of conductive layer 17 can be prevented from reacting with the silicon of semiconductor substrate 1 and the silicon of potential fixing electrode 12b, so that the semiconductor device can have high reliability.

Since the whole upper surface of the expanding part of potential fixing electrode 12b is connected to the emitter electrode, the contact area between potential fixing electrode 12b and the emitter electrode can be largely ensured. Thus, the potential of potential fixing electrode 12b can be fixed to the GND stably.

In addition, since the whole upper surface of the expanding part of potential fixing electrode 12b is connected to the emitter electrode, processing precision required for forming contact hole 13a shown in FIG. 8 does not need to be high.

If a contact hole is formed so as to reach only a part of the expanding part of potential fixing electrode 12b, the width of trench 1b for potential fixing electrode 12b has to be larger than the width of trench 1a for the gate electrode. Thus, when trench 1b and trench 1a are formed at the same etching process, trench 1b becomes deeper than trench 1a to some extent. As a result, electric field concentration is generated when a main withstand voltage is maintained during off time, which could cause the main withstand voltage to be lowered.

Meanwhile, according to the present embodiment, since the whole upper surface of the expanding part of potential fixing electrode 12b is in contact with the emitter electrode, the width of trench 1b can be the same as that of trench 1a. Thus, the electric field concentration when the main withstand voltage is maintained as described above can be prevented, and the main withstand voltage can be highly maintained.

In addition, since potential fixing electrode 12b is electrically connected with the emitter electrode and opposed to semiconductor substrate 1 across insulation film 11 to form a capacity, the potential of semiconductor substrate 1 can be fixed and stabilized by potential fixing electrode 12b.

According to the present embodiment, potential fixing electrode 12b is woven in a place where millions or billions of cell groups are repeatedly formed at the same pitch. Therefore, the semiconductor device according to the present embodiment is suitable for miniaturization of the cell dimension accompanied by high integration.

In addition, according to the present embodiment, even when the plurality of potential fixing electrode 12b are adjacently formed, p-type region 3 sandwiched between adjacent potential fixing electrodes 12b can electrically in contact with the emitter electrode. Thus, p-type region 3 sandwiched between adjacent potential fixing electrodes 12b does not become a floating state electrically, so that it can be surely the ground potential.

As one example of the method of forming the laminated structure having titanium silicide ($TiSi_2$) layer 14b and titanium nitride (TiN) layer 15 as shown in FIG. 1, a titanium (Ti) layer formed on a silicon by sputtering is processed by lamp annealing so that titanium silicide is formed on the lower side of the titanium layer that is in contact with the silicon and titanium nitride is formed on the upper side of the titanium layer by reaction with nitrogen gas in the lamp annealing atmosphere. The titanium silicide layer on the lower side is provided to improve ohmic characteristics, and the titanium nitride on the upper side becomes a barrier metal. According to the above method of forming the titanium nitride layer by thermal nitridation using the lamp annealing, since the thickness of the titanium layer is divided into the silicide layer on the lower side and the titanium nitride layer on the upper side.

Thus, when the titanium nitride layer needs to be thick, it is preferable that the titanium nitride layer is formed by a reactive sputtering method. When this method is used, a laminated structure consisting of titanium silicide layer 14b, reactive titanium nitride layer 15, and aluminum material layer 17 is provided. Aluminum material layer 17 includes pure aluminum, an aluminum-silicon (AlSi) alloy containing less than 1% of silicon, an aluminum-copper (AlCu) alloy, and an aluminum-silicon-copper (AlSiCu) alloy.

In the case of a bipolar IC (Integrated Circuit) and a power device, a platinum silicide (PtSi) layer that is a silicide layer having more preferable ohmic characteristics than titanium silicide is used as the silicide layer in some cases. In this case, a laminated structure consisting of the platinum silicide (PtSi) layer, a titanium tungsten (TiW) layer, and an aluminum material layer is used.

Embodiment 2

The constitution shown in FIG. 1 can be applied to a vertical type IGBT shown in FIGS. 13 to 15, a vertical type n-channel MOSFET (referred to as n-MOSFET hereinafter) shown in FIG. 16, and a lateral type IGBT shown in FIG. 17.

The vertical type means that a main current flows between electrodes formed on the first and second main surfaces of a semiconductor substrate. Further, the lateral type means that a main current flows between electrodes formed on the first main surface of a semiconductor substrate.

Figure 13:
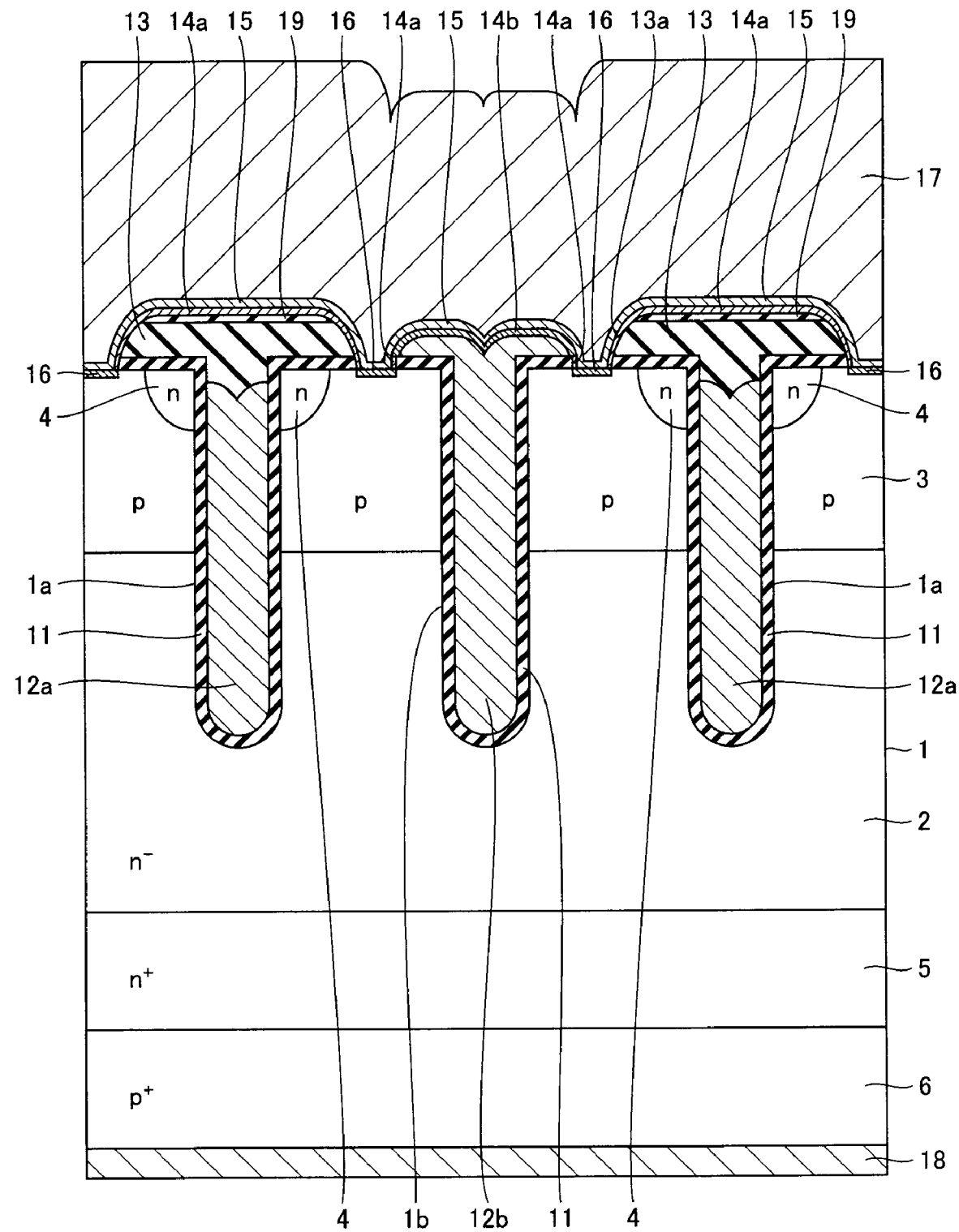
FIG. 13 is a sectional view schematically showing the constitution when the constitution shown in FIG. 1 is applied to a vertical PT type IGBT.

With reference to FIG. 13, this constitution is in a case where the constitution in FIG. 1 is applied to a vertical PT (Punch Through) type IGBT. In this constitution, $n^+$ region ($n^+$ buffer region) 5 and a $p^+$ region ($p^+$ collector region) 6 are sequentially formed on the second main surface side of $n^-$ region ($n^-$ drift region) 2 of semiconductor substrate 1. A main electrode (collector electrode) 18 is formed on the second main surface of semiconductor substrate 1 so as to be in contact with $p^+$ region ($p^+$ collector region) 6.

Figure 14:
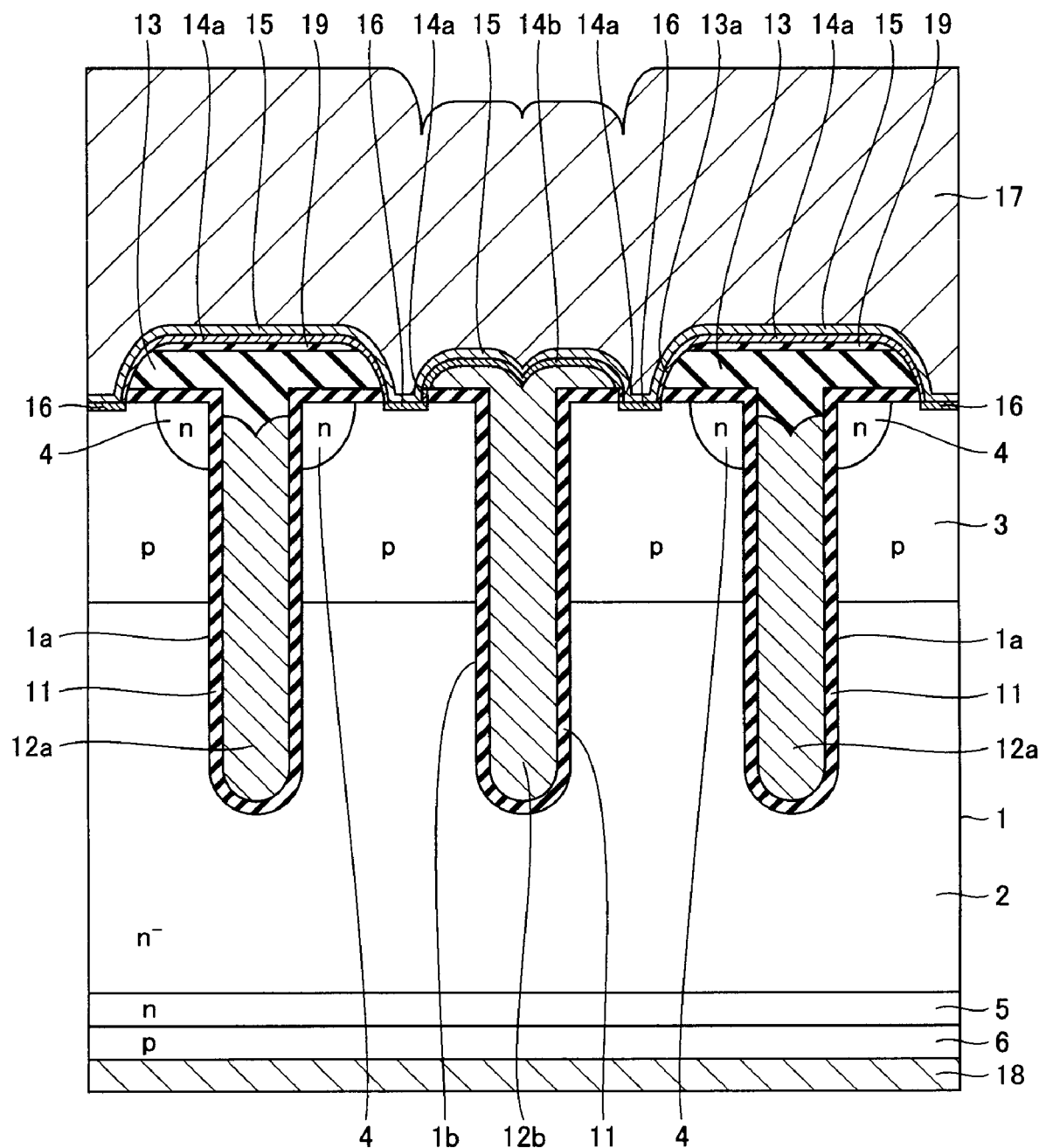
FIG. 14 is a sectional view schematically showing the constitution when the constitution shown in FIG. 1 is applied to a vertical LPT type IGBT.

Further, with reference to FIG. 14, this constitution is in a case where the constitution in FIG. 1 is applied to a vertical LPT (Light Punch Through) type IGBT. In this constitution, n-type region (n-type buffer region) 5 and p-type region (p-type collector region) 6 are sequentially formed on the second main surface side of $n^-$ region ($n^-$ drift region) 2 of semiconductor substrate 1. Main electrode (collector electrode) 18 is formed on the second main surface of semiconductor substrate 1 so as to be in contact with p-type region (p-type collector region) 6.

Figure 15:
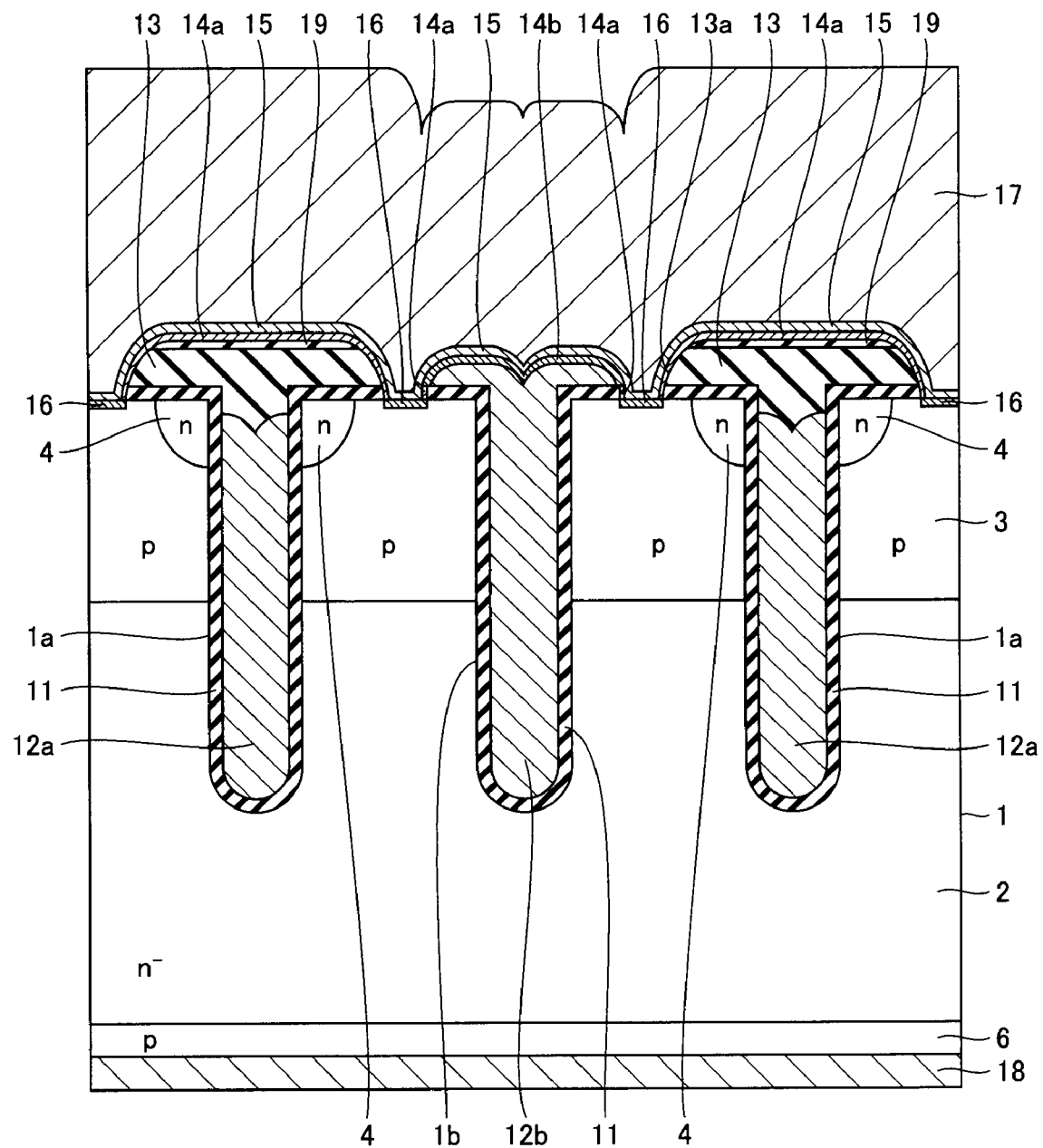
FIG. 15 is a sectional view schematically showing the constitution when the constitution shown in FIG. 1 is applied to a vertical NPT type IGBT.

With reference to FIG. 15, this constitution is in a case where the constitution in FIG. 1 is applied to a vertical NPT (Non Punch Through) type IGBT. In this constitution, p-type region (p-type collector region) 6 is directly formed on the second main surface side of $n^-$ region ($n^-$ drift region) 2 of semiconductor substrate 1. Main electrode (collector electrode) 18 is formed on the second main surface of semiconductor substrate 1 so as to be in contact with p-type region (p-type collector region) 6.

Figure 16:
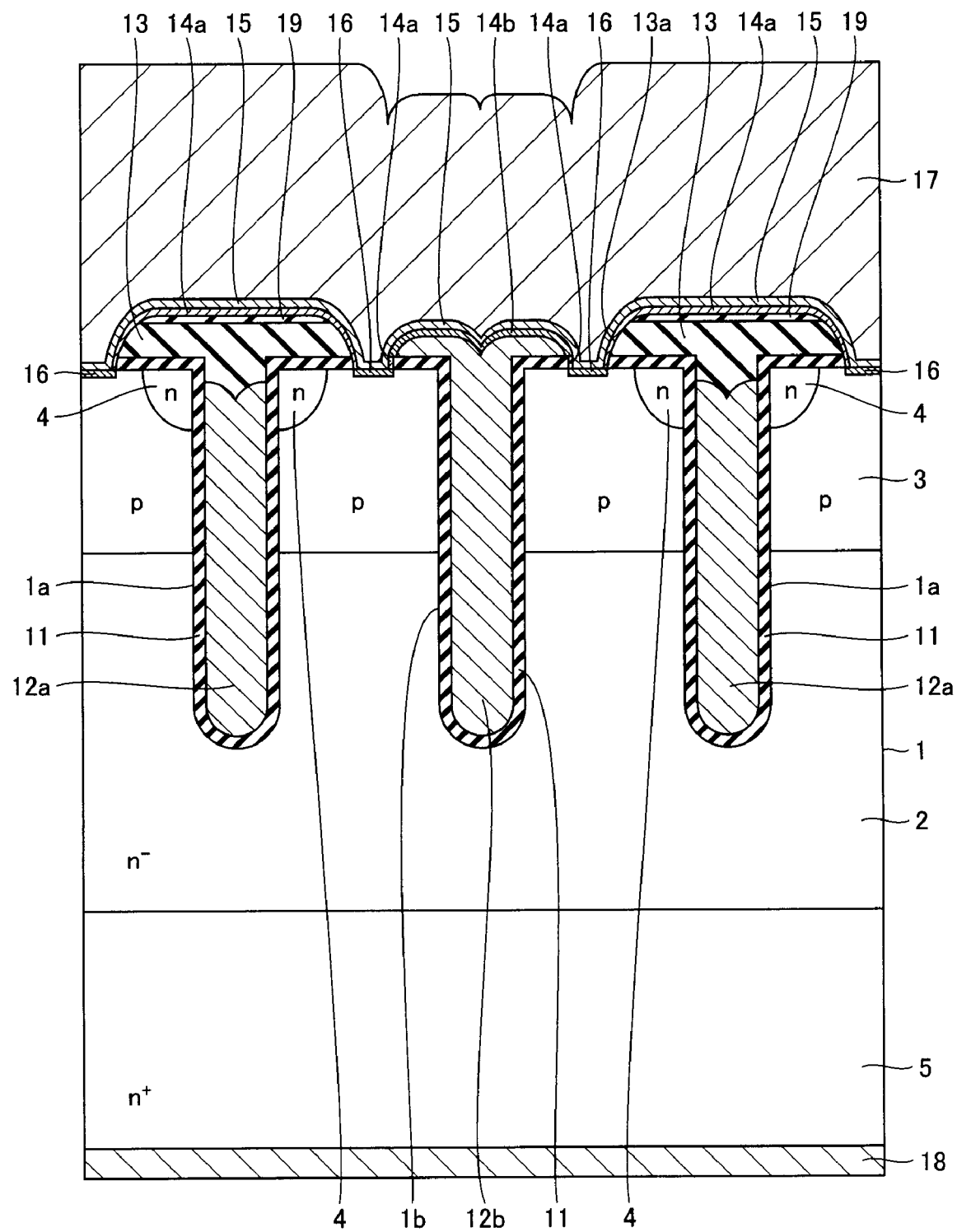
FIG. 16 is a sectional view schematically showing the constitution when the constitution shown in FIG. 1 is applied to a vertical MOSFET.

With reference to FIG. 16, in this constitution, $n^+$ region ($n^+$ drain region) 5 is directly formed on the second main surface side of $n^-$ region ($n^-$ drift region) 2 of semiconductor substrate 1. Main electrode (drain electrode) 18 is formed on the second main surface of semiconductor substrate 1 so as to be in contact with $n^+$ region ($n^+$ drain region) 5.

Figure 17:
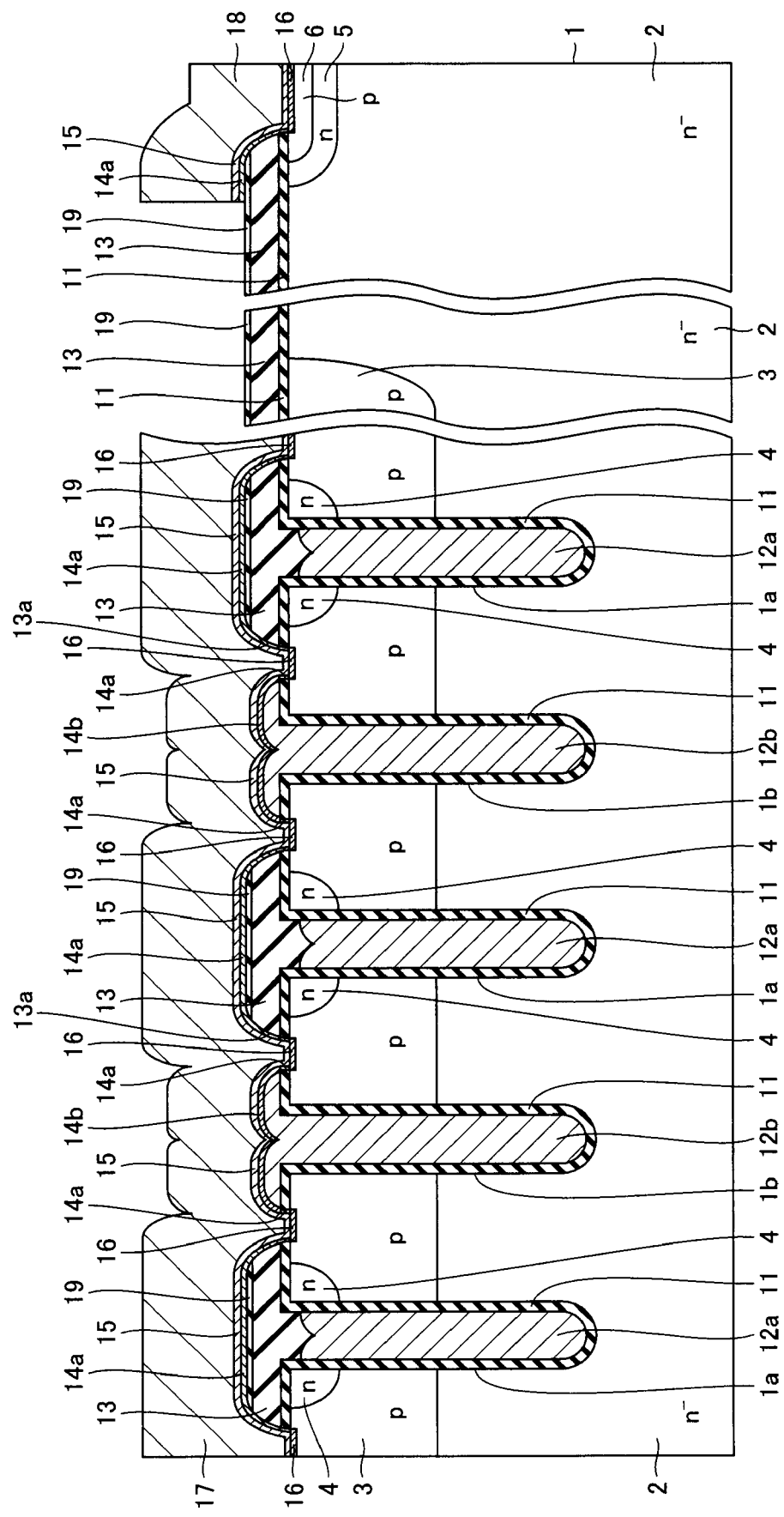
FIG. 17 is a sectional view schematically showing the constitution when the constitution shown in FIG. 1 is applied to a lateral IGBT.

With reference to FIG. 17, in this constitution, n-type region (n-type buffer region) 5 is formed in $n^-$ region ($n^-$ drift region) 2 in the first main surface of semiconductor substrate 1. In addition, p-type region (p-type collector region) 6 is formed in n-type region (n-type buffer region) 5 in the first main surface of semiconductor substrate 1.

A main electrode (collector electrode) region is formed on the first main surface so as to be in contact with p-type region (p-type collector region) 6. The main electrode (collector electrode) has silicide layer 16 being in contact with p-type region (p-type collector region) 6, unreacted high melting point metal 14a formed on insulation films 11, 13, and 19, barrier metal layer 15 formed on silicide layer 16 and high melting point metal 14a, and conductive layer 18 formed of aluminum on barrier metal layer 15 on the first main surface of semiconductor substrate 1.

The constitution of the lateral type IGBT shown in FIG. 17 can be obtained such that the constitution of the vertical PT type IGBT shown in FIG. 13 is made to be the lateral type. Similarly, the constitution shown in FIG. 1 may be applied to the one in which the LPT type vertical IGBT shown in FIG. 14 is made to be the lateral type, and the one in which the NPT type vertical IGBT shown in FIG. 15 is made to be the lateral type.

Since the constitution other than the above in FIGS. 13 to 17 is almost the same as that in Embodiment 1 shown in FIG. 1, the same signs are allotted to the same components and description thereof will not be given.

Also in each of the constitutions shown in FIGS. 13 to 17, since potential fixing electrode 12b has the expanding part on the first main surface so that width w2 thereof is larger than width w1 of trench 1b, a gap is prevented from being generated between potential fixing electrode 12b and trench 1b, so that the semiconductor device having high reliability can be provided.

Embodiment 3

While the case where the gate of the insulated gate field effect part has the trench gate structure has been described in Embodiment 1 shown in FIG. 1, the gate of the insulated gate field effect part may have a planar gate structure. Hereinafter, the constitution will be described.

Figure 18:
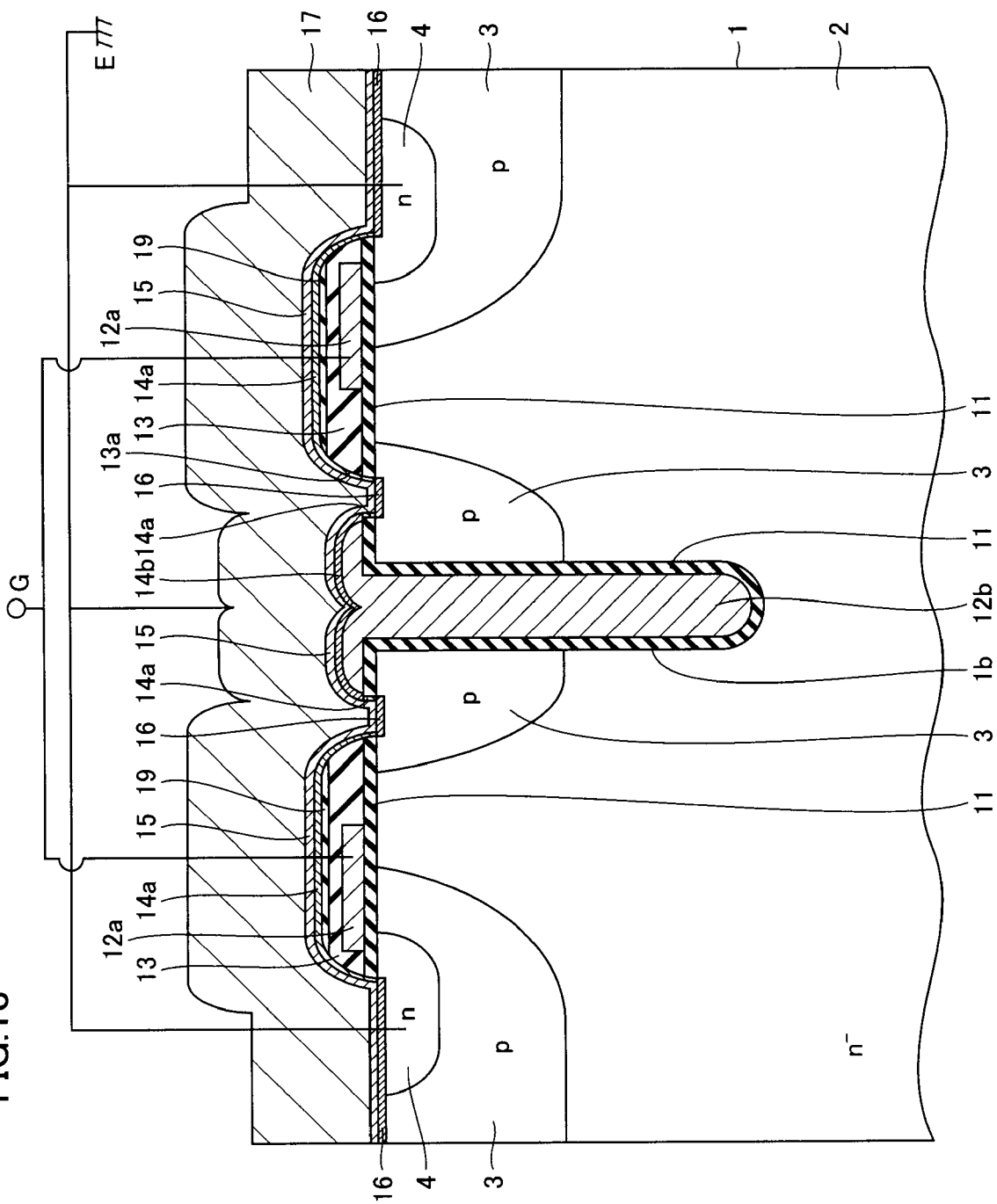
FIG. 18 is a sectional view schematically showing the constitution of a semiconductor device having a planar gate structure according to Embodiment 3 of the present invention.

With reference to FIG. 18, $n^-$ region 2 serving as a drift region, for example, is formed in semiconductor substrate 1 formed of silicon. P-type region 3 serving as a base region, for example, is selectively formed on $n^-$ region 2 on the first main surface side of semiconductor substrate 1. N-type region 4 serving as an emitter region (source region), for example, is selectively formed in p-type region 3 on the first main surface side of semiconductor substrate 1.

On the first main surface, gate electrode 12a is formed on p-type region 3 sandwiched between n-type region 4 and $n^-$ region 2 through insulation film (gate insulation film) 11. Gate electrode 12a is formed on the flat first main surface and not formed in a trench. Insulation film (gate electrode) 11 is formed of a silicon oxide film and gate electrode 12a is formed of a nonmetal material having a conductive property such as a doped polysilicon layer.

An insulated gate field effect part is formed by gate electrode 12a, insulation film (gate insulation film) 11, $n^-$ region 2, n-type region 4, and p-type region 3.

Since the constitution other than the above in the present embodiment is almost the same as that in Embodiment 1 shown in FIG. 1, the same signs are allotted to the same components and description thereof will not be given.

Thus, even when the gate of the insulated gate field effect part has the planar gate structure, since, similarly to Embodiment 1, potential fixing electrode 12b has an expanding part on the first main surface so that a width thereof is larger than that of trench 1b, a gap is prevented from being generated between potential fixing electrode 12b and the wall surface of trench 1b, so that highly-reliable semiconductor device can be provided.

The constitution of the present embodiment can be also applied to the vertical type IGBT shown in FIGS. 13 to 15 and the vertical type MOSFET shown in FIG. 16 and the lateral type IGBT shown in FIG. 17 similar to the constitution of Embodiment 1.

Embodiment 4

While the IGBT and MOSFET have been described in Embodiments 1 to 3, the present invention can be applied to another element having an insulated gate field effect part, and applied to a carrier storage type IGBT, MCT (MOS-Controlled Thyristor), IEGT (Injection Enhanced Gate Transistor) and the like. Hereinafter, their constitutions will be described.

Figure 19:
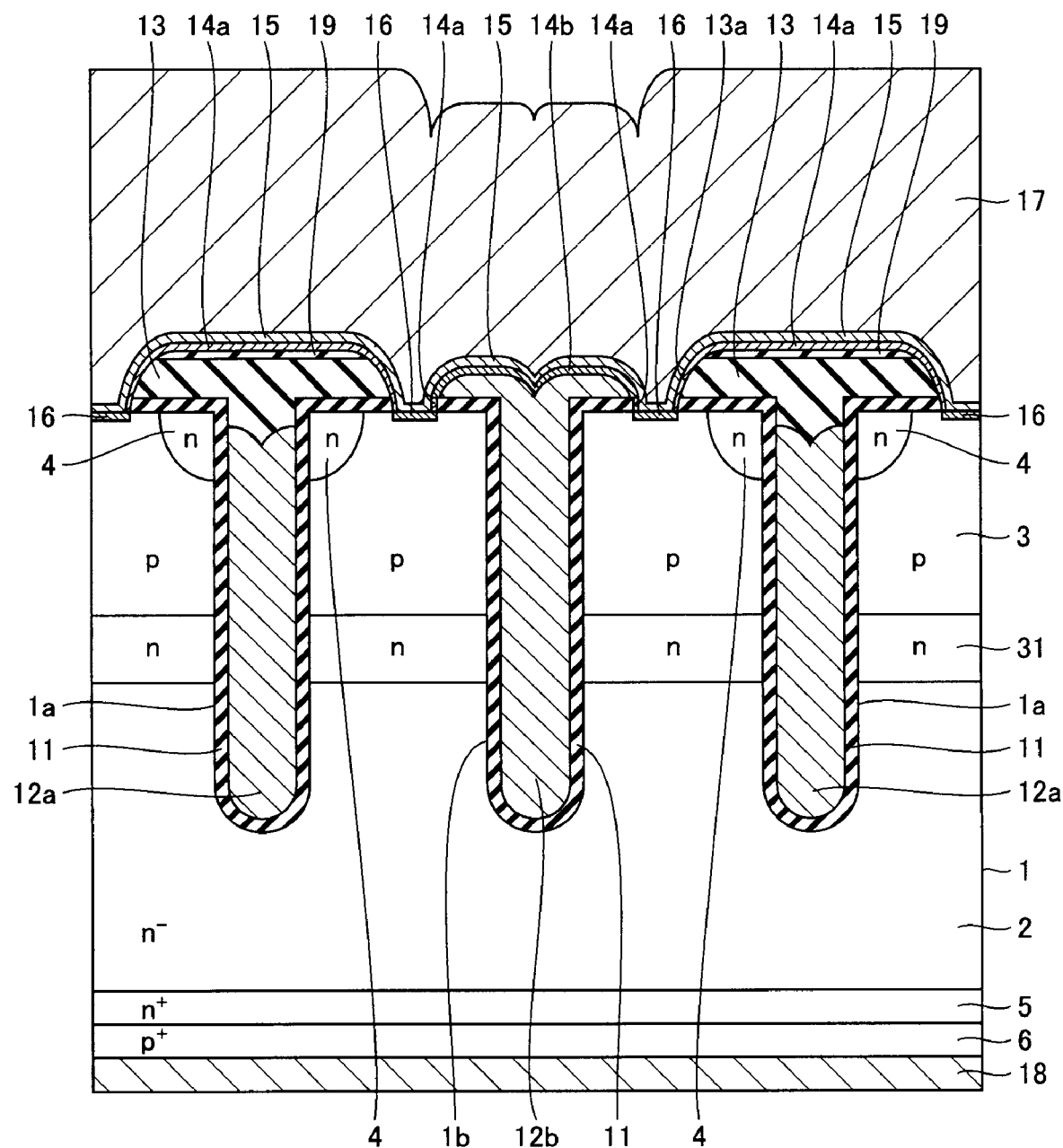
FIG. 19 is a sectional view schematically showing the constitution of a carrier storage type IGBT as a semiconductor device according to Embodiment 4 of the present invention.

With reference to FIG. 19, a carrier storage type IGBT according to the present embodiment is different from the PT type vertical IGBT shown in FIG. 13 in that an n-type CS (Carrier Stored) layer 31 is added between $n^-$ region 2 and p-type region 3.

Since the constitution of the carrier storage type IGBT other than the above is almost the same as the constitution shown in FIG. 13, the same signs are allotted to the same components and description thereof will not be given.

Figure 20:
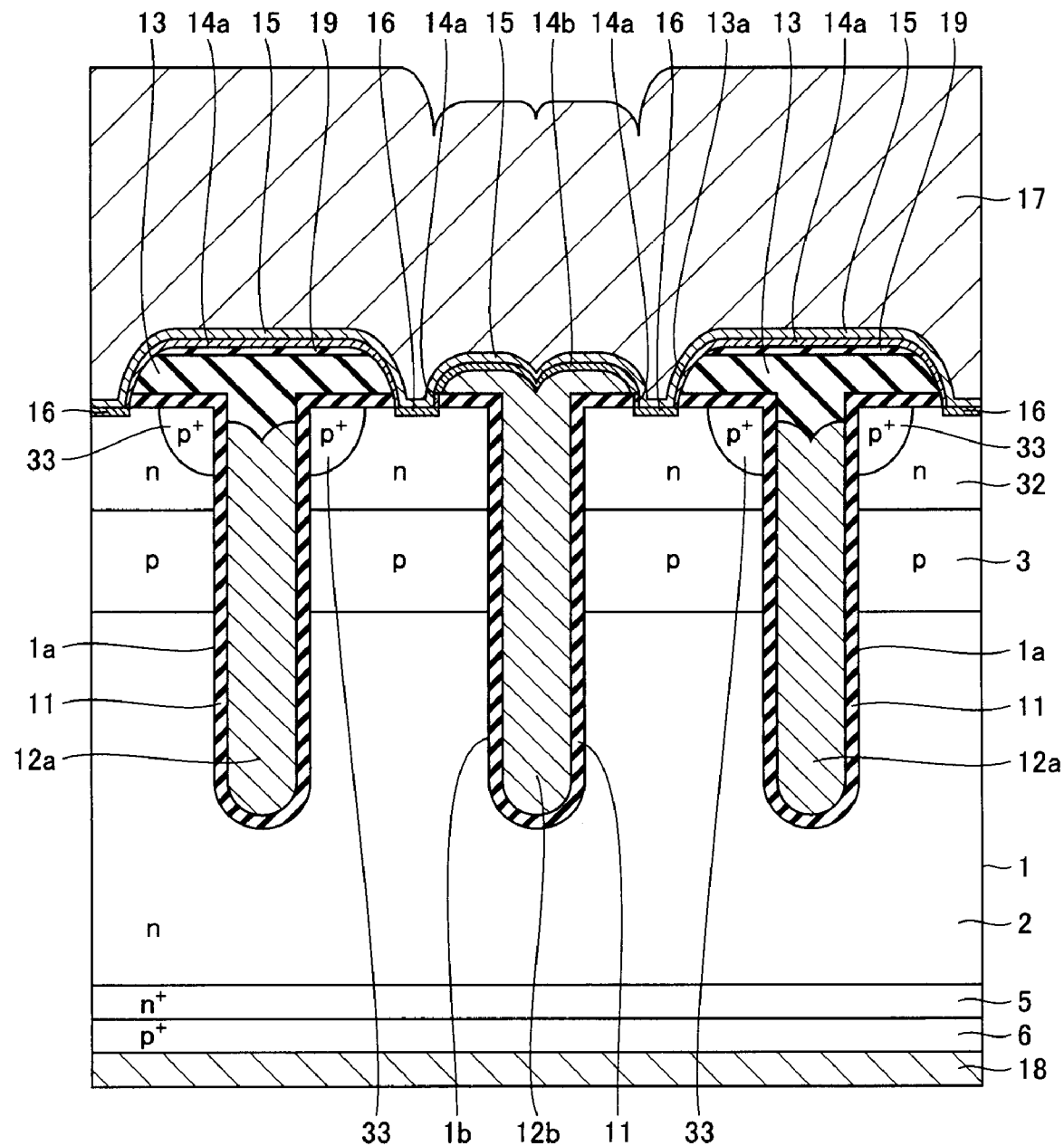
FIG. 20 is a sectional view schematically showing the constitution of a MCT as a semiconductor device according to Embodiment 4 of the present invention.

With reference to FIG. 20, according to an MCT in the present embodiment, n⁻ region 2 serving as a drift region, for example, is formed in semiconductor substrate 1 formed of silicon, for example. P-type region 3 serving as a base region, for example, and an n-type region 32 serving as a cathode region, for example, are sequentially formed on n⁻ region 2 on the side of the first main surface of semiconductor substrate 1. A p⁺ region 33 serving as a short emitter region, for example, is selectively formed in n-type region 32 on the side of the first main surface of semiconductor substrate 1.

Trench 1a is formed in the first main surface of semiconductor substrate 1 so as to penetrate p⁺ region 33, n-type region 32 and p-type region 3 and reaching n⁻ region 2. In addition, trench 1b is formed in the first main surface of semiconductor substrate 1 in which p⁺ region 33 is not formed is formed so as to penetrate n-type region 32 and p-type region 3 and reaching n⁻ region 2. Insulation film 11 formed of a silicon oxide film, for example, is formed so as to cover the inner wall surface of each of trenches 1a and 1b and the first main surface of semiconductor substrate 1. Gate electrode 12a is formed in trench 1a and potential fixing electrode 12b is formed in trench 1b.

Since the constitution of the MCT other than the above is almost the same as the constitution shown in FIG. 13, the same signs are allotted to the same components and description thereof will not be given.

Figure 21:
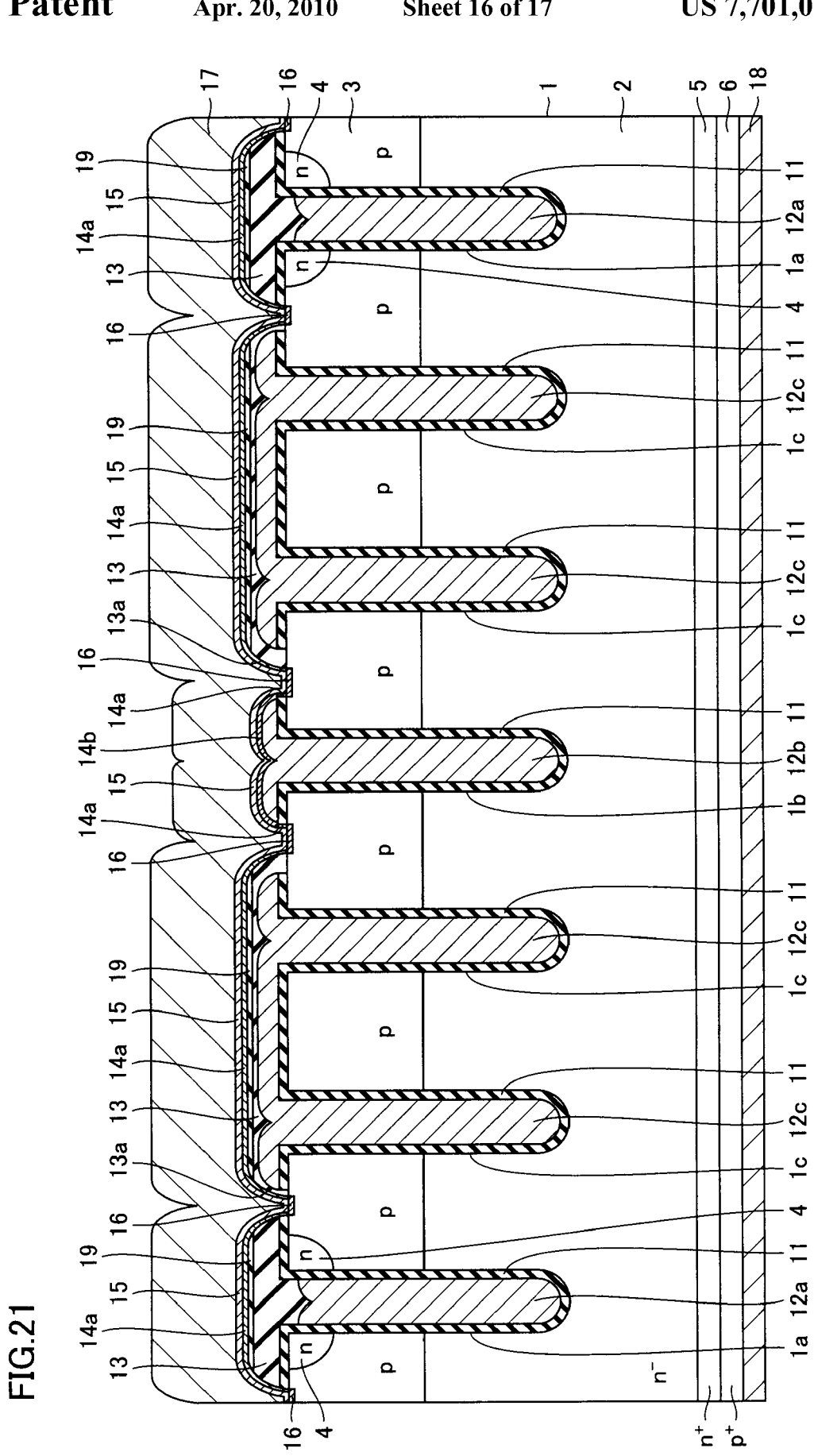
FIG. 21 is a sectional view schematically showing the constitution of an IEGT as a semiconductor device according to Embodiment 4 of the present invention.

With reference to FIG. 21, an IEGT according to the present embodiment is different from the PT type vertical IGBT shown in FIG. 13 in that a gate thinning structure is added between gate electrode 12a and potential fixing electrode 12b.

This gate thinning structure has at least two trenches 1c, and dummy gates 12c filling trenches 1c. Each of two trenches 1c is formed in the first main surface of semiconductor substrate 1 in which n-type region 4 is not formed so as to penetrate p-type region 3 and reach n⁻ region 2. Insulation film 11 formed of a silicon oxide film is formed on the inner wall of each of two trenches 1c.

Each of two trenches 1c is filled with dummy gate 12c. Dummy gate 12c filling each of two trenches 1c has an expanding part so that a width thereof is larger than the width of trench 1c. The expanding parts of adjacent dummy gates 12c are connected on the first main surface of semiconductor substrate 1, whereby adjacent dummy gates 12c have the same potential. P-type region 3 sandwiched between two trenches 1c is in an electrically floating state.

Insulation films 13 and 19 are formed so as to cover the expanding parts of two dummy gates 12c. An emitter electrode is formed on insulation films 13 and 19.

The number and interval of dummy gates 12c in the IEGT can be set arbitrarily according to the characteristics (main withstand voltage level, current density, operation speed and the like) and the structure required to the IEGT.

Since the constitution of the IEGT other than the above is almost the same as the constitution shown in FIG. 13, the same signs are allotted to the same components and description thereof will not be given.

Thus, in any of the carrier storage type IGBT, MCT and IEGT, similar to Embodiment 1, since potential fixing electrode 12b has the expanding part on the first main surface such that a width thereof is larger than the width of trench 1b, a gap is prevented from being generated between potential fixing electrode 12b and the wall surface of trench 1b, whereby a highly-reliable semiconductor device can be provided.

(Other)

Another example with a different shape of an emitter region will be described.

Figure 22A:
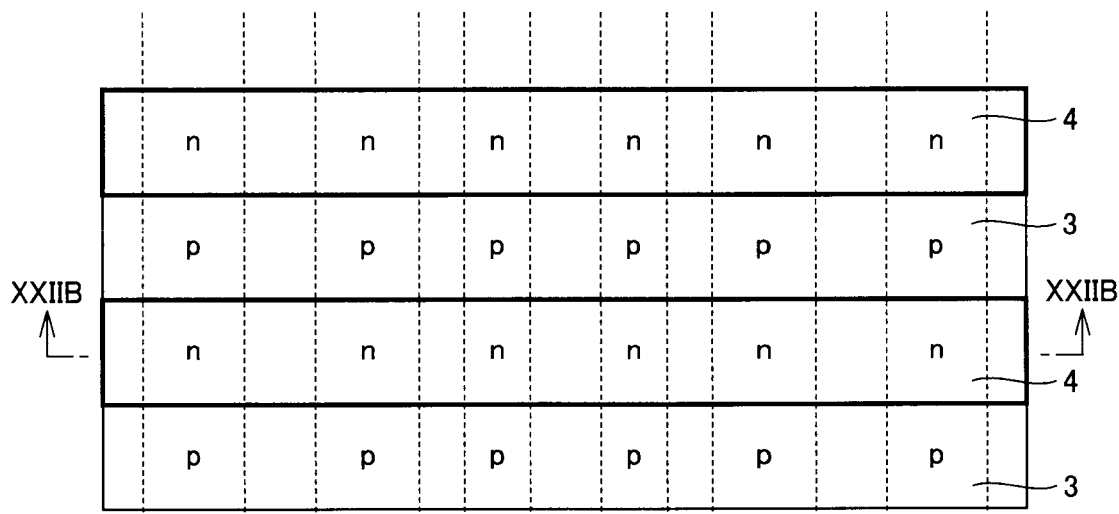
FIG. 22A is a schematic plan view showing an example in which the shape of an emitter region is changed and showing a state where an emitter electrode and the emitter region are electrically connected.
Figure 22B:
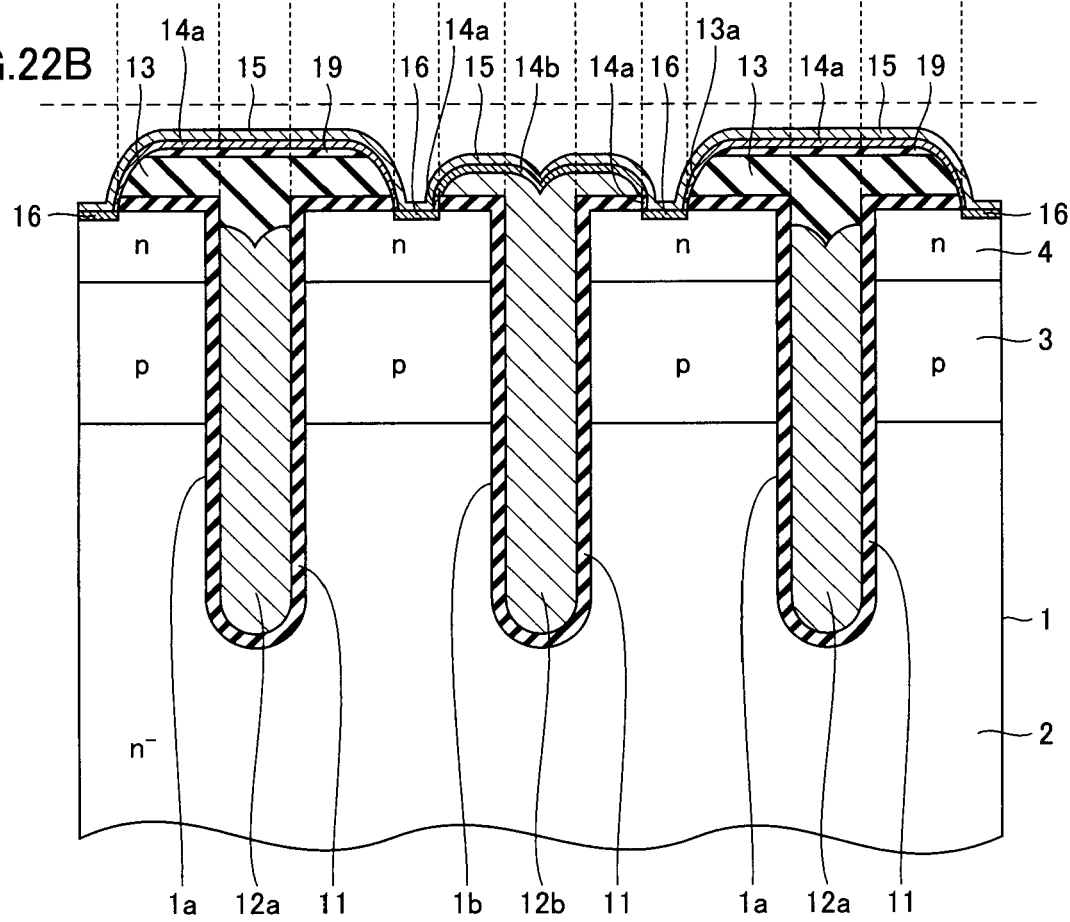
FIG. 22B is a schematic sectional view taken along a line XXIIB-XXIIB in FIG. 22A.

FIGS. 22A and 22B show an example in which the shape of the emitter region is changed, in which FIG. 22A is a schematic plan view showing the electric connection between an emitter electrode and the emitter region, and FIG. 22B is a schematic sectional view taken along line XXIIB-XXIIB in FIG. 22A. With reference to FIG. 22A, n-type region (emitter region) 4 and p-type region (base region) 3 are arranged in the shape of stripe in the direction intersecting (at right angle, for example) with the extending direction of trenches 1a and 1b on the first main surface of semiconductor substrate 1. That is, as shown by thick lines in FIG. 22A, n-type region (emitter region) 4 is formed in the shape of a band although it is divided by trenches 1a and 1b in a plan view. In addition, p-type region (base region) 3 is also formed in the shape of a band although it is divided by trenches 1a and 1b in the plan view.

Thus, n-type region (emitter region) 4 and p-type region (base region) 3 are formed in a band shape on the first main surface alternately in plan view, and the band-shaped region of n-type region (emitter region) 4 is formed of n-type region (emitter region) 4 only except for trenches 1a and 1b, and the band-shaped region of p-type region (base region) 3 is formed of p-type region (emitter region) 3 only except for trenches 1a and 1b.

Since n-type region (emitter region) 4 and p-type region (base region) 3 are arranged in a stripe shape, silicide layer 16 is in contact with both n-type region (emitter region) 4 and p-type region (base region) 3. Therefore, according to the emitter electrode, silicide layer 16 is electrically in contact with both n-type region (emitter region) 4 and p-type region (base region) 3.

While description has been made for the case where the material of semiconductor substrate 1 is silicon in the above embodiments, the material of semiconductor substrate 1 according to the present invention is not limited to the silicon material and it may be a semiconductor material other than silicon or a semiconductor material formed of a compound of silicon and another element. For example, the material of semiconductor substrate 1 includes a wide band gap material such as silicon carbide (SiC) or gallium nitride (GaN), or a compound semiconductor material such as silicon germanium (SiGe), gallium arsenic (GaAs), indium phosphorus (InP), or gallium aluminum arsenic (GaAlAs), or a II-VI compound semiconductor material such as diamond, pyloritic graphite, p-BN (Pyloritic Boron Nitride), cadmium sulfide (CdS), or cadmium selenium that is a wide band gap semiconductor material formed of carbon element.

The present invention can be especially advantageously applied to a power semiconductor device.

The conductivity types (p-type and n-type) shown in the above embodiments may be reversed.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor substrate having a first main surface and a trench in said first main surface;

an element having an insulated gate field effect part including a gate electrode formed in said first main surface;

a potential fixing electrode filling said trench and having an expanding part on said first main surface so that a width of the expanding part is larger than that of said trench; and a first main electrode formed on said first main surface, electrically insulated from said gate electrode, and connected to an upper surface of said expanding part of said potential fixing electrode, said first main electrode comprising first metal films and a second metal film formed on said first metal films, said second metal film having a melting point lower than that of said first metal films, and said second metal film is formed of a material which more readily reacts with a material of said semiconductor substrate than a material of said first metal films.

2. The semiconductor device according to claim 1, wherein said element is a bipolar transistor having said insulated gate field effect part.

3. The semiconductor device according to claim 1, wherein said semiconductor substrate has a second main surface opposed to said first main surface, said semiconductor device further comprises a second main electrode formed on said second main surface, and said element is a vertical type element in which a main current flows between said first main electrode and said second main electrode.

4. The semiconductor device according to claim 1, wherein said second metal film is not in direct contact with the expanding part of the potential fixing electrode.

* * * * *